(12) United States Patent
Rodriguez et al.

(10) Patent No.: US 7,158,032 B2
(45) Date of Patent: Jan. 2, 2007

(54) DIAGNOSIS OF PROGRAMMABLE MODULES

(75) Inventors: Alberto Rodriguez, Webster, NY (US); Heiko Rommelmann, Penfield, NY (US); Scott J. Bell, Webster, NY (US); Ronald P. Boucher, Rochester, NY (US); William H. Phipps, Fairport, NY (US)

(73) Assignee: Xerox Corporation, Stamford, CT (US)

( * ) Notice: Subject to any disclaimer, the term of this patent is extended or adjusted under 35 U.S.C. 154(b) by 64 days.

(21) Appl. No.: 10/850,190

(22) Filed: May 20, 2004

(65) Prior Publication Data

US 2005/0258963 A1    Nov. 24, 2005

(51) Int. Cl.
*G08B 13/14* (2006.01)
*G03G 15/00* (2006.01)
*B41J 29/393* (2006.01)

(52) U.S. Cl. .................. 340/572.1; 399/24; 347/19

(58) Field of Classification Search ............ 340/10.51, 340/10.52, 10.1–10.6, 568.1–572.9; 347/19; 399/262, 182, 9–11, 18, 24–30, 81; 714/50–57
See application file for complete search history.

(56) References Cited

U.S. PATENT DOCUMENTS

| | | | |
|---|---|---|---|
| 6,008,727 A | 12/1999 | Want et al. | 340/572.1 |
| 6,163,361 A * | 12/2000 | McIntyre et al. | 355/18 |
| 6,176,425 B1 | 1/2001 | Harrison et al. | 235/385 |
| 6,262,662 B1 | 7/2001 | Back et al. | 340/572.1 |
| 6,326,946 B1 | 12/2001 | Moran et al. | 345/156 |
| 6,346,884 B1 | 2/2002 | Uozumi et al. | 340/572.1 |
| 6,351,621 B1 | 2/2002 | Richards et al. | 399/111 |
| 6,584,290 B1 | 6/2003 | Kurz et al. | 399/12 |
| 6,644,771 B1 * | 11/2003 | Silverbrook | 347/19 |
| 6,710,891 B1 * | 3/2004 | Vraa et al. | 358/1.12 |
| 6,739,691 B1 * | 5/2004 | Walker | 347/19 |
| 6,945,713 B1 * | 9/2005 | Vraa et al. | 396/511 |
| 2004/0046033 A1 * | 3/2004 | Kolodziej et al. | 235/487 |
| 2004/0124988 A1 * | 7/2004 | Leonard et al. | 340/612 |
| 2004/0135838 A1 * | 7/2004 | Owen et al. | 347/19 |
| 2005/0125093 A1 * | 6/2005 | Kikuchi et al. | 700/213 |
| 2005/0128051 A1 * | 6/2005 | Dickinson et al. | 340/5.61 |
| 2005/0229020 A1 * | 10/2005 | Goodman et al. | 714/2 |
| 2005/0258961 A1 * | 11/2005 | Kimball et al. | 340/572.1 |

OTHER PUBLICATIONS

Copending U.S. Appl. No. 10/849,686, filed concurrently herewith, entitled "Control of Programmable Modules," by William H. Phipps et al.

(Continued)

*Primary Examiner*—Daniel Wu
*Assistant Examiner*—Jennifer A. Mehmood
(74) *Attorney, Agent, or Firm*—David J. Arthur

(57) ABSTRACT

An electronic diagnostic device for testing electronic monitoring tags for devices such as replaceable modules for a printing apparatus includes a tag reader with a reader wireless communication element. The tag reader is adapted to read tag diagnostic information from an electronic monitoring tag. The electronic diagnostic device further includes a data processor in communication with the tag reader. The data processor is adapted to determine from the tag diagnostic data whether the electronic monitoring tag is operating within predetermined parameters, to identify one of a predetermined set of error categories if the electronic monitoring tag is operating outside the predetermined parameters, and to generate error category information. The electronic diagnostic device further includes a results communication element adapted to communicate the error category information generated by the data processor. The diagnostic device may also communicate correction information to the electronic monitoring tag.

17 Claims, 16 Drawing Sheets

OTHER PUBLICATIONS

Copending U.S. Appl. No. 10/849,976, filed concurrently herewith, entitled "Control of Programmable Modules," by William H. Phipps et al.

Copending U.S. Appl. No. 10/849,973, filed concurrently herewith, entitled "Control of Programmable Modules," by Heiko Rommelmann et al.

Copending U.S. Appl. No. 10/849,974, filed concurrently herewith, entitled "Control of Programmable Modules," by Heiko Rommelmann et al.

*The Write Stuff: Understanding the Value of Read/Write RFID Functionality*, Technologies Corporation, 2003, pp. 1-4.

*Applications*, Intermec—Authentication, Applications for Flying Null Technology, www.flying-null.com, May 20, 2003.

*Flying Null*, A Unique Product Identity, Flying Null Technology—the new concept in remote magnetic sensing, www.flying-null.com, May 20, 2003.

Copending U.S. Appl. No. 10/458,848, filed Jun. 11, 2003, entitled "Printer Module With On-Board Intelligence," by Heiko Rommelmann et al.

* cited by examiner

DIAGNOSIS OF PROGRAMMABLE MODULES

CROSS-REFERENCE TO RELATED APPLICATIONS

Reference is made to commonly-assigned U.S. patent application Ser. No. 10/849,686, filed concurrently herewith, now U.S. Publication No. 2005/0258962, entitled "Control of Programmable Modules," by Heiko Rommelmann et al., U.S. patent application Ser. No. 10/849,976, filed concurrently herewith, now U.S. Publication No. 2005/0258932, entitled "Control of Programmable Modules," by Heiko Rommelmann et al., U.S. patent application Ser. No. 10/849,973, filed concurrently herewith, now U.S. Publication No. 2005/0258931, entitled "Control of Packaged Modules," by Heiko Rommelmann et al., U.S. patent application Ser. No. 10/849,974, filed concurrently herewith, now U.S. Publication No. 2005/0258228, entitled "Control of Programmable Modules," by Heiko Rommelmann et al., the disclosures of which are incorporated herein.

BACKGROUND AND SUMMARY

The present invention relates to programmable devices or modules. In one aspect, the present invention is particularly useful in diagnosing and/or correcting errors or anomalies in programmable devices associated with modules for apparatus such as document printers.

Radio frequency identification (RFID) devices include radio frequency transmitters that have been applied to products for tracking purposes. Such RFID devices contain information that they can transmit to a reader. The radio frequency transmitters do not require "line of sight" access from the reader. The RFID devices are able to contain a variety of information.

Electronic module tags are associated with modules, such as replaceable machine portions. Exemplary modules include replaceable elements of a printing apparatus, such as toner bottles and ink cartridges. Although a toner container for a xerographic printer is described, after studying the present description, a person of skill in the art will recognize the applicability of the principles to other types of devices.

The electronic module tag contains information pertaining to the module. An electronic module tag may include a radio frequency identification device.

In certain circumstances, the electronic module tags may contain or develop errors or performance anomalies that may affect the information contained in the tag. Such errors could cause problems with the operation of the electronic module tag and, in some cases, with the module or apparatus to which the tag is attached or otherwise associated. Diagnosing and correcting such errors has typically required that the electronic module tag be returned to a central facility.

In accordance with an aspect of the present invention, an electronic diagnostic device for testing electronic module tags associated with replaceable modules for a printing apparatus includes a tag reader comprising a reader wireless communication element, in which the tag reader is adapted to read tag diagnostic information from an electronic module tag associated with a replaceable module for a printing apparatus using the reader wireless communication element. The electronic diagnostic device further includes a data processor in communication with the tag reader, in which the data processor is adapted to determine from the tag diagnostic data whether the electronic module tag is operating within predetermined parameters. The data processor contains a predetermined set of error categories, and the data processor is additionally adapted to identify one of the error categories if the electronic module tag is operating outside the predetermined parameters, and to generate error category information. The electronic diagnostic device further includes a results communication element in communication with the data processor, and adapted to communicate the error category information generated by the data processor.

In accordance with another aspect of the invention, an electronic diagnostic device includes a tag reader, a data processor in communication with the tag reader, and a results communication element in communication with the data processor. The tag reader is adapted to read tag diagnostic information from an electronic module tag associated with a replaceable module of a printing apparatus. The data processor is adapted to analyze the tag diagnostic data to produce tag diagnosis information. The tag reader is for communicating the tag diagnosis information.

In accordance with yet another aspect of the present invention, a method of testing electronic module tags associated with replaceable modules of printing apparatus includes bringing a portable electronic reader device into proximity with a first electronic tag associated with a replaceable module of a printing apparatus, causing the portable electronic tag reader to read tag diagnostic data from the first electronic tag, electronically determining from the tag diagnostic data whether the first electronic tag is operating within predetermined operating parameters, and transmitting an error signal if the first electronic tag is not operating within the predetermined operating parameters.

DETAILED DESCRIPTION

Programmable tags are attached to, or otherwise associated with, various types of products, such as replaceable modules for document printing apparatus or other machinery. Such programmable tags include a tag memory in which information can be stored.

Figure 1:
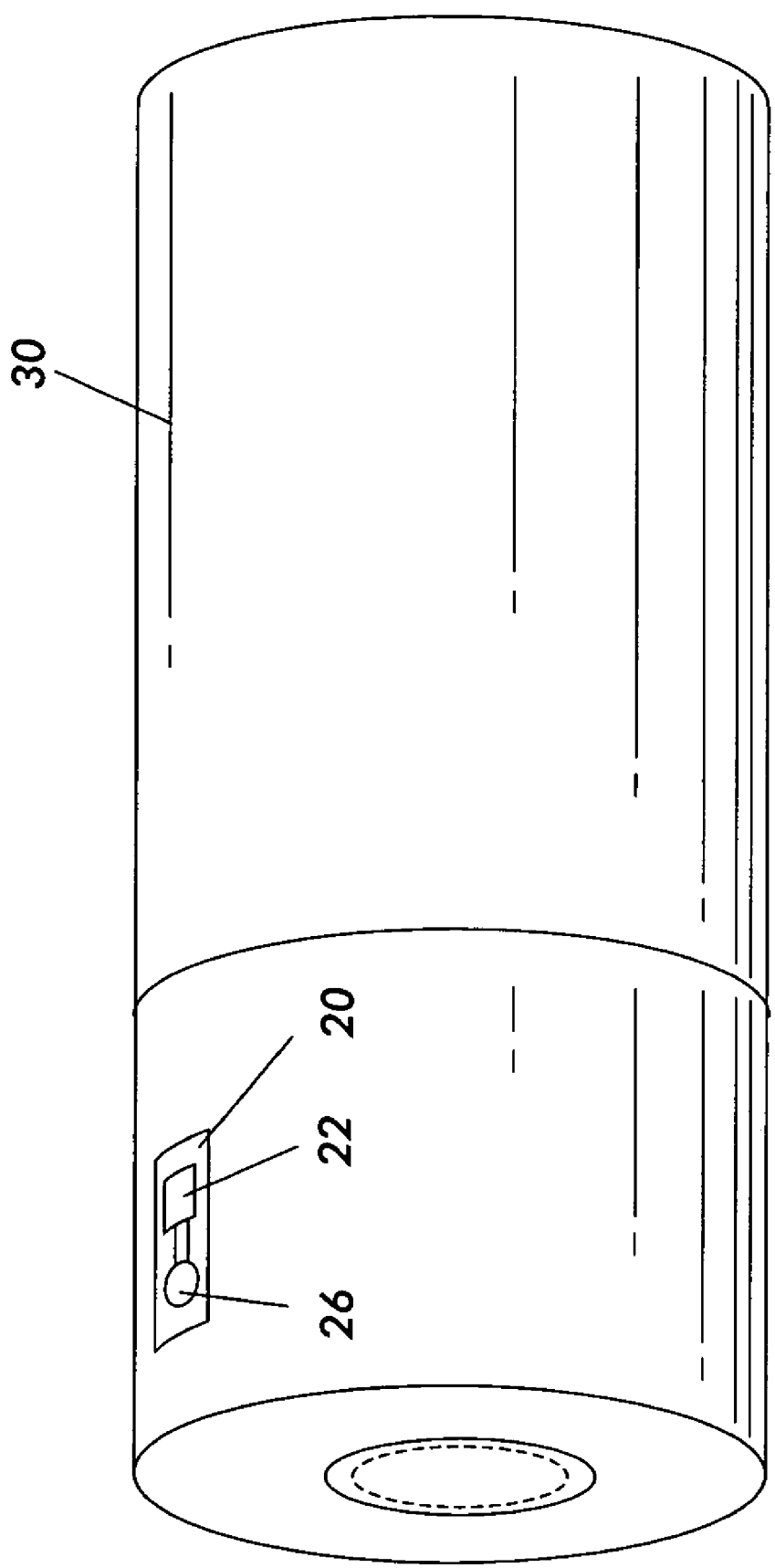
FIG. 1 shows an exemplary application of a programmable module tag to a module.

Referring to FIG. 1, a programmable electronic module tag 20 is associated with a module, such as a replacement part or consumable element for machinery or systems. Particular implementations will be described in the context of a consumable module for a printing apparatus, in particular a toner cartridge 30 containing consumable toner. The cartridge 30 is intended for insertion into a xerographic printing apparatus, in which toner is dispensed from the cartridge for use in the printing process. The person of skill in the art, having reviewed the subject disclosure, will recognize that the principles thereof can be applied to a wide variety of systems and uses. The term "module" is used to mean any device to which an electronic tag might be attached, or with which a tag might be associated.

Figure 2:
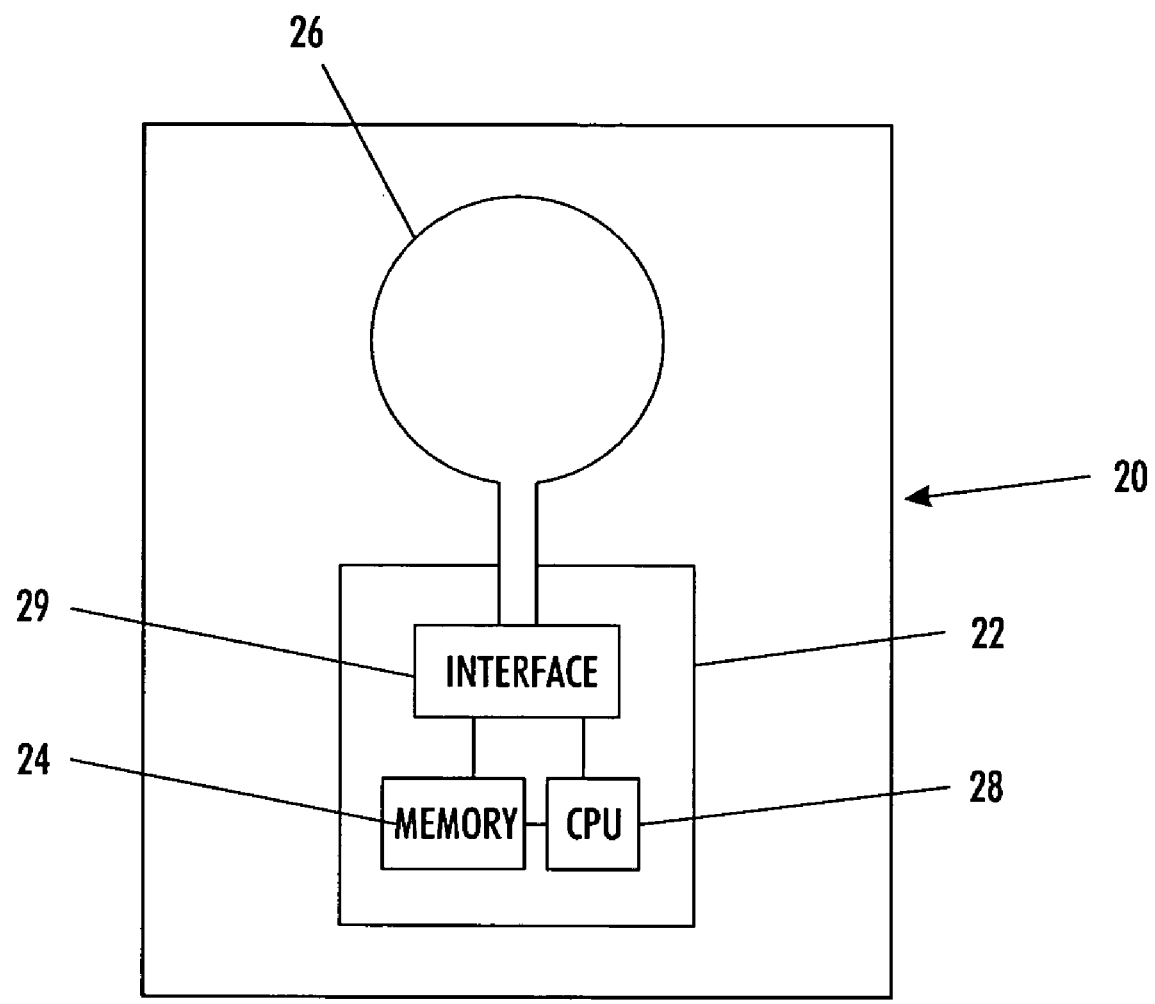
FIG. 2 shows an exemplary implementation of a programmable module tag.

An exemplary electronic module tag 20 is shown in FIG. 2. The electronic tag includes tag electronics 22 that include tag memory 24 for storing information, and a tag communication element 26 for communicating information to and from the electronic module tag. In an implementation, a processor (CPU) 28 provides computational and other capabilities. Interface electronics 29 connect the CPU 28, memory 24, and communication element 26. Many configurations are available for arranging and connecting elements of the electronic module tag. In some implementations, the electronic monitoring tag may not include a CPU.

In a particular implementation, the communication element 26 is a wireless communication element for establishing a wireless communication link with another device. In a particular implementation, the wireless communication element is a radio frequency (RF) antenna for establishing a radio frequency communication link with another device.

The wireless communication element can be an active element, powered by a power source, such as a battery (not shown) embedded on the tag. Alternatively, the wireless communication element can be passive. Such a passive element is energized by the RF signal it receives from another device, such as an RF reader that queries the tag, or an RF writer that delivers information to the tag. Energy from the reader or writer is sufficient to briefly power the RF antenna and interface electronics to enable the RF antenna to receive and transmit information.

Information is stored in the tag memory contained within the tag electronics. Particular information can be stored at particular locations in the tag memory. Information can be read from the tag memory through the communication element. When the communication element is activated, the RF antenna can transmit selected information from the tag memory. In an implementation, information received at the RF antenna can also be written into the tag memory.

In addition to, or in lieu of, the wireless communication element 26, a wired communication element (not shown) may connect the tag memory 24 through a plug or other connector to an external communication system for delivering information to, and drawing information from, the tag memory.

Figure 3:
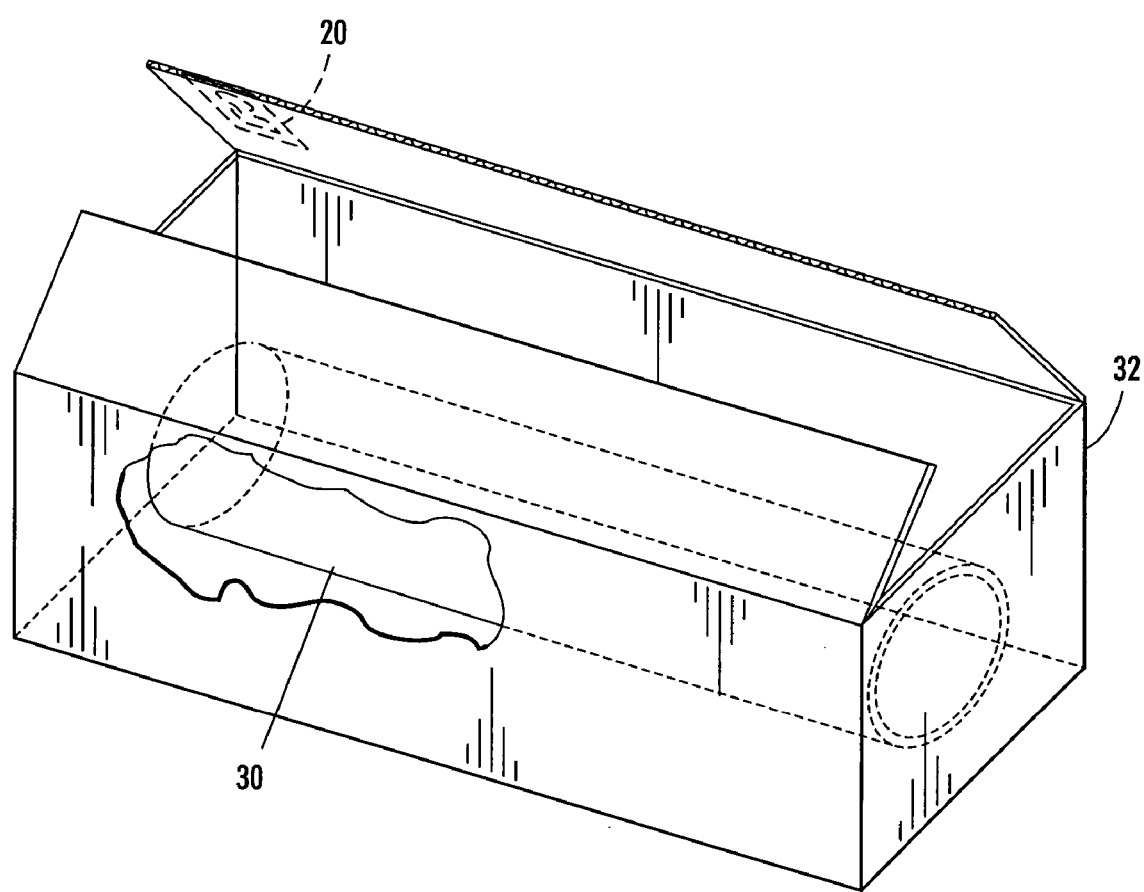
FIG. 3 shows an exemplary application of a programmable module tag to a container for a module.
Figure 4:
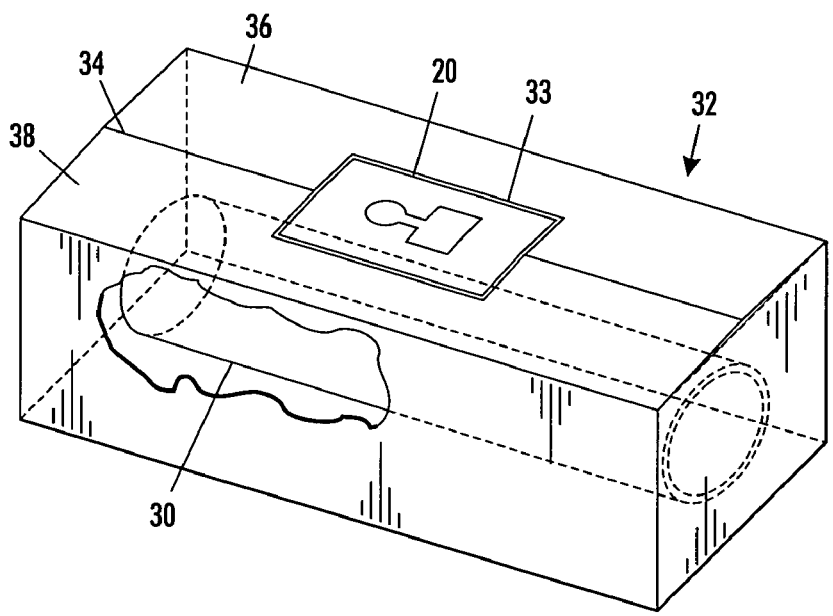
FIG. 4 shows another application of a programmable module tag to a container for a module.
Figure 5:
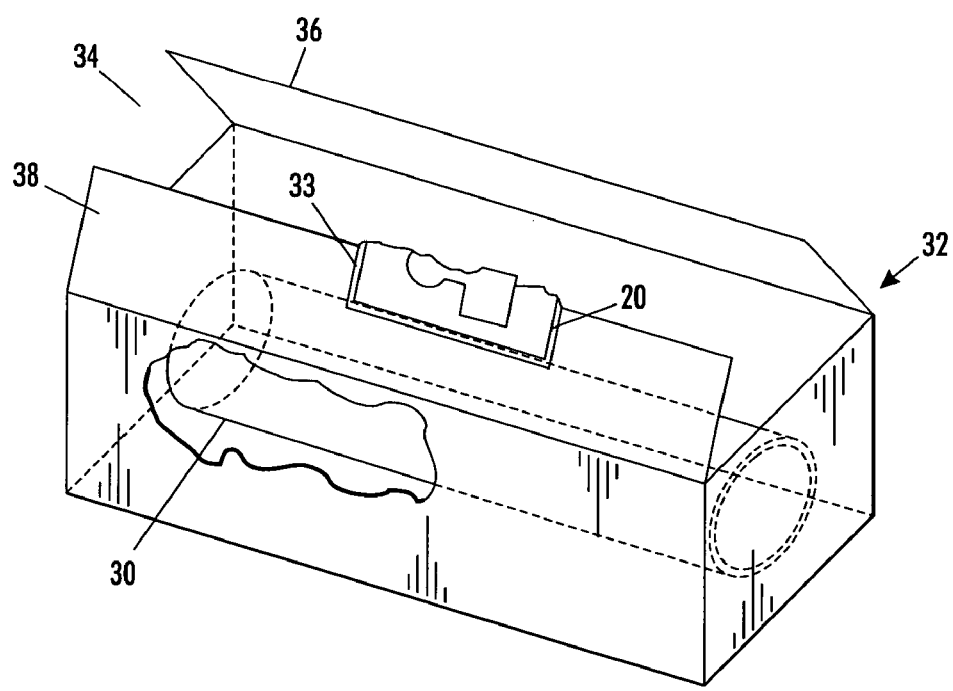
FIG. 5 shows the programmable module tag applied as shown in FIG. 4, after the container has been opened.

The electronic module tag 20 can be attached directly to the toner cartridge module 30, as shown in FIG. 1. In addition, or in alternatives, the module 30 is enclosed within a container 32 for storage and transport, as shown in FIGS. 3–5. As seen in FIG. 3, the tag 20 is embedded in the material forming the container (such as corrugated cardboard). Although a rectilinear container is shown, other shapes can be used for the container. In addition to the replaceable module for the printing apparatus, the container may also enclose packing material (not shown) to protect the enclosed module. In some instances, the container may enclose multiple modules, which may be identical to one another, or may form a set of related modules. The module, such as the toner cartridge 30, is associated with an electronic module tag 20 on the container 32 by placing the module in the container having the programmable electronic tag 20. The module enclosed within the container may or may not have a separate electronic tag 20 affixed directly to the module (FIG. 1).

In an example shown in FIGS. 4 and 5, the electronic tag 20 is attached with a label 33 to the container 32. One portion of the container (shown in FIG. 4 as the top) has an opening separation 34 that is adapted to expand upon opening the container. In the particular implementation illustrated, the opening separation is formed in the top surface by forming the top surface as two sections 36, 38 of container material that meet at a seam that forms the opening separation 34. The container with the opening separation expanded to open the container is shown in FIG. 5. Other types of opening separations are also known. For example, the container may be formed of a container body with an open side and a separate piece of material to form a lid, having an opening separation that extends around the perimeter of the lid, where the edge of the lid meets the container body. Other types of opening separations might include a pull tab that tears the container material, or that has a line of perforations to permit the pull tab to separate to sections of the container. The label bearing the electronic tag is securely attached to the container, preferably spanning the opening separation.

Information can be stored in the tag memory by tag programming or tag writing equipment. One system for programming tag memories is described in U.S. patent application Ser. No. 10/634,934, entitled Control Of Programming Electronic Devices, and filed Aug. 5, 2003 by Alberto A. Rodriguez et al, the contents of which are hereby incorporated by reference.

Figure 6:
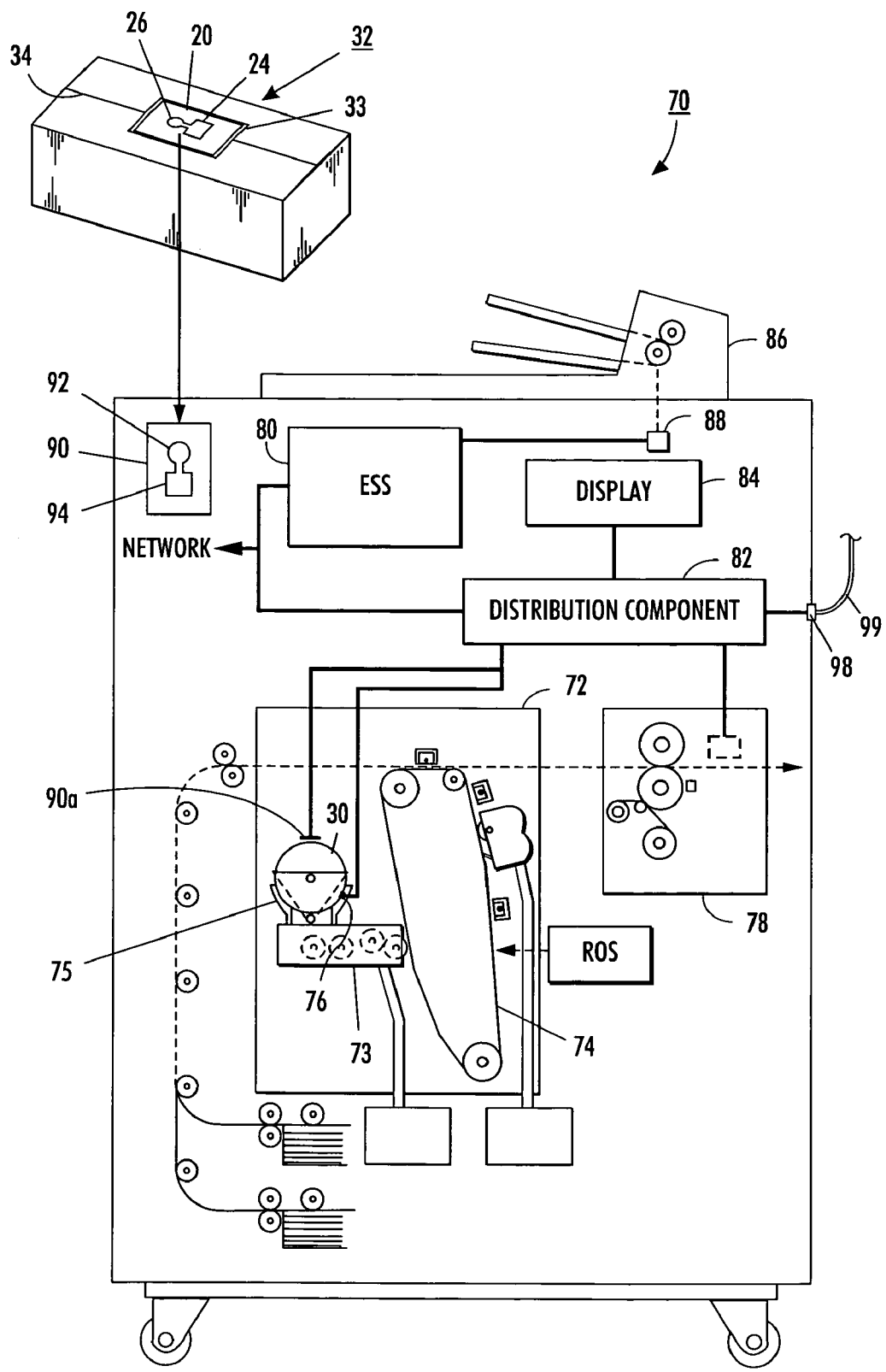
FIG. 6 is a conceptual illustration of a printing apparatus incorporating one implementation of a module tag reader.

FIG. 6 shows a representative printing apparatus 70 that might use the module 30 enclosed within the container 32. The representative printing apparatus includes a printing subsystem 72, which, in the illustrated example, is a xerographic printing subsystem that includes a photoreceptor 74, and a developer 73. A toner cartridge, such as the toner cartridge module 30 enclosed within the container, is inserted into the printing subsystem. The developer draws toner from the toner cartridge into the developer. The printing apparatus additionally includes a fuser subassembly 78, an electronic subsystem 80 for processing control signals, and a distribution component 82 for controlling the distribution of electronic signals from the electronic subsystem to the printing subassembly and the fusing subassembly. The distribution components may also deliver information to a graphical display 84 for conveying information to the machine user. The printing apparatus may include a copying function, in which case a document handler 86 passes documents past a scanner 88.

The printing apparatus includes a printer tag reader 90 that includes a wireless reader communication element 92 for receiving information transmitted by the communication element 26 of the module tag 20. The tag reader on the printing apparatus includes reader electronics 94 and an RF antenna forming the wireless reader communication element 92. The RF antenna emits radio frequency signals of sufficient strength to energize the RF antenna forming the tag communication element 26 on the tag when the tag is brought into proximity with the printer tag reader. Upon being energized, the tag communication element transmits information stored in the tag memory portion of the tag electronics 24. The wireless reader communication element 92 receives that information, and either processes the information within the printer tag reader electronics 94, or transmits the information to the printer electronic subsystem 80 of the printing apparatus.

The printer tag reader electronics 94 or the printer electronic subsystem 80 analyze the tag information received from the module tag 20. The tag information read and analyzed by the printer tag reader electronics 94 or the printer electronic subsystem 80 includes the configuration information stored in the tag memory. The analysis may be to verify that the tag information indicates that the module enclosed in the container is appropriate for the particular printing apparatus by comparing the tag configuration information with predetermined configuration parameters. For example, the printer electronic subsystem may verify that the tag information indicates that the module is intended for a printing apparatus with the appropriate type of maintenance agreement that covers the particular printing apparatus 70. In an alternative, the electronic subsystem may use the tag information from the tag on the container to determine the type of material in the container. The printer electronic subsystem 80 may be configured to perform various actions depending on the information received. For example, the information received from the tag may indicate to the electronic subsystem how the printer should be configured to take advantage of the module contained in the container. The electronic subsystem can also be configured to issue a notice on a printer user interface, such as a graphical display 84, if the tag information read from the module tag indicates that an incorrect module is being presented to the printing apparatus. The electronic subsystem may even be programmed to block insertion of the module into the printing apparatus if the information read from the tag memory does not agree with the expected information.

In certain implementations, a module tag 20 is attached directly to the module 30 so that the contents of the module tag can be read by a printer tag reader 76 in the printing apparatus during use of the printing apparatus. The printing apparatus may be adapted so that if the printing apparatus, through the printer tag reader, determines that the module tag is programmed with one set of configuration information, the printing apparatus operates in a first manner, or if the module tag is programmed with a second set of configuration information, the printing apparatus operates in a second, different manner. If the module is a toner cartridge for a developer 73, such differences may include adjustments such as altering the concentration of toner deposited by the developer onto the photoreceptor 74. Or the differences may include adjustments to the methodology the printing apparatus uses to estimate toner usage, or other factors affecting printer performance.

Figure 7:
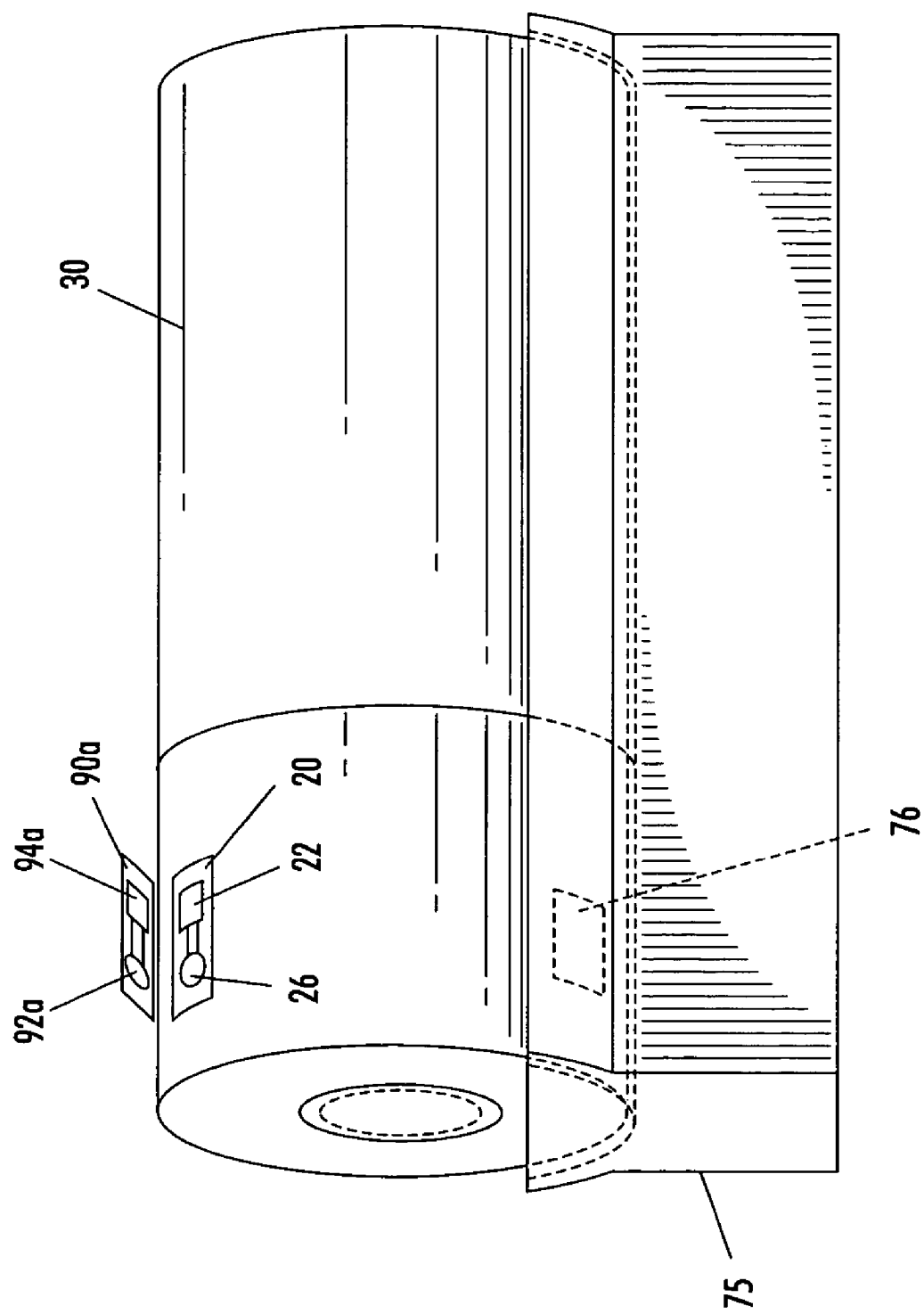
FIG. 7 is a simplified elevational view of the installation of a portion of the printing apparatus of FIG. 6.

Referring, for example, to FIG. 7, the printer tag reader is installed adjacent where the module 30 is to be installed. The printer may include an insertion tray 75 to receive the toner module. The printer tag reader 76 may be contained in the insertion tray. In other implementations, a printer tag reader 90a is mounted adjacent the insertion tray, or along the path that the module 30 takes as the module is inserted into the printer. The printer tag reader 90a includes a wireless communication element 92a and reader electronics 94a.

Information can also be stored in the tag memory of the module tag 20 after the module tag has been attached to a particular module, attached to the container enclosing a particular module, or in some other manner associated with a particular module. Thus, information can be added to the tag memory at different times and when the module is at different locations.

Information stored on the module tag may relate to the printer machine with which the module is to be used, such as the printer 70. During operation of the printer, certain information about the usage of the printer and/or the module may be stored in the module tag. Such information may include number of prints or copies made, amount of toner used, or similar operational information.

The information stored in the tag memory may affect operation of the machine. The information may affect machine settings, the number of machine operations (prints or copies) performed, and other performance issues. Therefore, malfunctions in the module tag, including errors in data stored in the tag memory, may impact machine performance.

Figure 8:
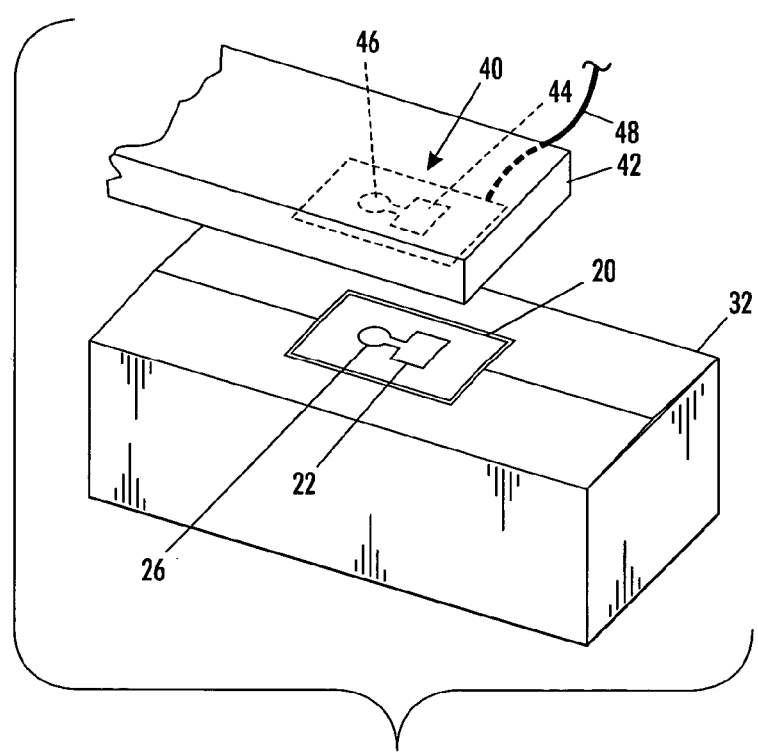
FIG. 8 illustrates a use of a stationary module tag diagnostic device to analyze a module tag.
Figure 9:
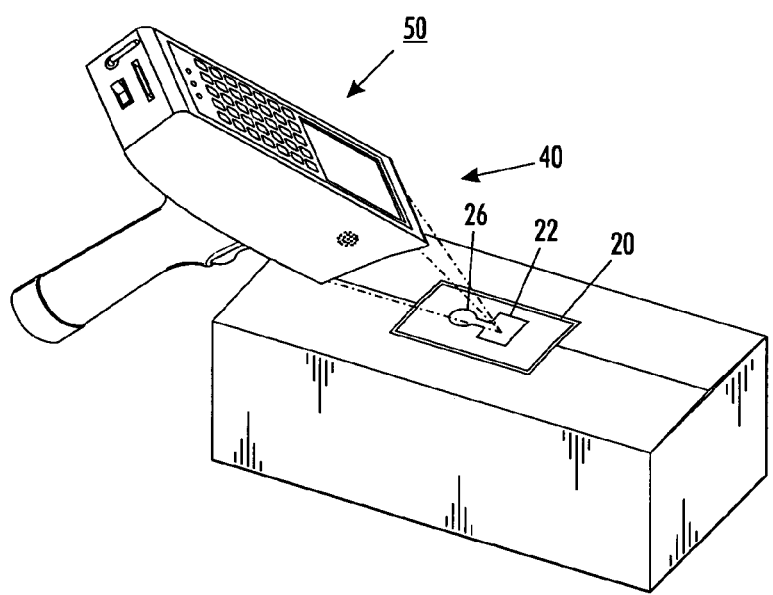
FIG. 9 illustrates a use of a portable tag diagnostic device to analyze a module tag.
Figure 10:
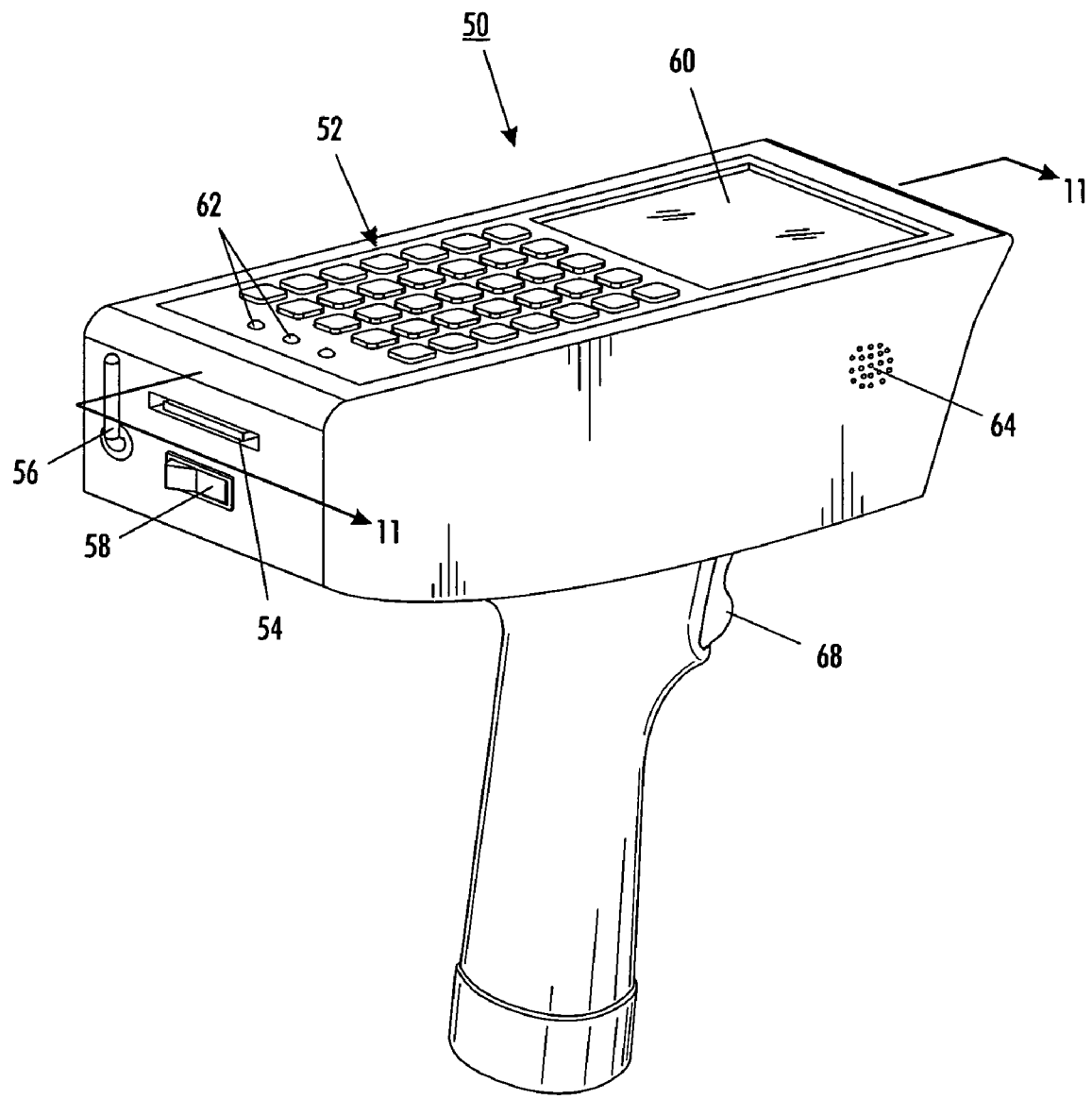
FIG. 10 is a perspective view of one implementation of a portable module tag diagnostic device.

A tag diagnostic device 40 (FIGS. 8 and 9) is adapted to determine if there is a malfunction in the tag, including the tag memory. The tag diagnostic device 40 may have a fixed location, as shown in FIG. 8. The tag diagnostic device is secured to a fixture 42. The stationary tag diagnostic device and its fixture are configured so that a module or a container enclosing a module, bearing a programmable electronic module tag, can be brought into proximity with the tag diagnostic device. In other implementations, the tag diagnostic device may be included in a portable tag processing device 50, as shown in FIG. 9.

The tag diagnostic device 40 includes a tag reader that can electronically read information from the electronic module tag, and a tag writer that can program information into the electronic module tag. In either the fixed or portable tag diagnostic device, most, if not all, components may be shared between the tag reader and the tag writer. The tag diagnostic device 40 includes diagnostic device electronics 44 (shown stylistically), and a diagnostic device communication element 46. The diagnostic device communication element 46 communicates with the tag communication element 26 of the electronic module tag to form a communication link between the tag diagnostic device and the electronic module tag.

In an example, the tag diagnostic device communication element 46 is a wireless communication element, such as an RF antenna. The RF antenna of the tag diagnostic device emits sufficient energy to energize the RF antenna of the wireless communication element 26 of the tag when the tag diagnostic device communication element 46 and the tag communication element 26 are within a predetermined operating range of one another. Thus, the tag diagnostic device establishes a communication link between the tag diagnostic device and the electronic tag.

Once a communication link is established between the tag diagnostic device and the electronic module tag, the tag diagnostic device and the electronic tag can exchange information across that communication link. Although a radio frequency wireless communication link is shown, other types of communication links can also be used. For example, wires connected with plugs or sockets (not shown) can provide wired communication links between the tag reader and the electronic tag. An external communication link provided by, for example, a wire or cable 48, allows data to pass to and/or from the tag diagnostic device to another system, such as a computer or other information management system.

A portable tag processing device 50 incorporating the tag diagnostic device 40 includes user interface components. Such user interface components include a user input element so a user can provide information to the tag diagnostic device, and a user notification element so the tag diagnostic device can convey information to the user.

An exemplary portable tag processing device is shown in FIGS. 10–13. An exemplary portable tag processing device is described in U.S. patent application Ser. No. 10/849,686, entitled "Control of Programmable Modules," filed concurrently herewith by Heiko Rommelman et al, the contents of which are hereby incorporated by reference. The user input element includes a keypad 52 connected to electronics 44 contained inside the processing service. The keypad provides a means for a user to supply input information, such as programming instructions, to the device electronics 44. Information, such as user input information, can also be supplied to the tag processing device through other communication ports, such as a wired communication port 54. The wired communication port can be either a serial or parallel data port. A connecting device, such as a cable, is selectively attached to the wired communications port. External user information input devices, such as a laptop or desktop computer, can be connected to the tag processing device though the communication port 54. The device electronics of the tag processing device may include device memory for storing information during operation. Internal storage allows the tag processing device to download (or upload) data and information at intervals. This capability to store information allows tag processing device to be operated for a time without being in continuous communication with an external system through the communications port.

Communication to the portable tag diagnostic device can also be conducted wirelessly, such as with infrared or radio frequency signals. An external antenna 56 provides an exemplary connection point for receiving user input information from another element or system over a wireless communication link. An antenna switch 58 provides the ability to connect or disconnect the external antenna, or to transfer communication capability between the external antenna and the communications port 54. Persons familiar with the art will identify other mechanisms for supplying information from a user to the tag processing device 50 for use by the tag diagnostic device.

The tag diagnostic device electronics 44 include a data processor 59. The data processor processes data received at the diagnostic device communication element 46, and also information received from a user input element such as the keypad 52 or a device communicating through the wired communication port 54 or the other external antenna 56. The data processor manipulates the data according to predetermined criteria. For example, the data processor can be adapted to interpret instructions received from the user input element, to verify information that is received from a module tag over the programmer communication element 46, or to perform calculations upon data received from the module tag. The tag diagnostic device processor is also adapted to cause certain information to be communicated to the module tag, such as by transmitting the information over the programmer communication element 46.

The user interface of the tag processing device also includes user notification elements for communicating information to the user. The user notification elements may include a graphical user interface 60, signal lights 62, and/or an audio output 64. The graphical user interface is adapted to display graphical or text messages, and may be a liquid crystal display (LCD) screen. The diagnostic device electronics control the messages displayed on the graphical user interface. The graphical user interface can also display information confirming the data entered by the user on the keypad 52.

Signal lights 62 can provide simple visual signals to the user. For example, two signal lights may be included, with one red to indicate a negative condition or result, and the other green to indicate a positive condition or result. A third signal light may indicate a separate function, such as a power-on condition, or may provide a tri-level condition indicator. Other embodiments may have other numbers of signal lights. The signal lights may be light emitting diodes (LED's), incandescent bulbs, or other light emitting devices.

An audio output, such as a speaker 64, is adapted to provide additional user notification by emitting one or more audible signals. Different types of audible signals may signal different conditions. For example, a 'buzzer' tone may indicate a negative condition or result, while a 'beep' tone may indicate a positive condition or result. Audible signals can be used to draw attention to certain conditions. In certain instances, simple signaling devices such as the signal lights and the audio signal output may be able to provide sufficient information to the user, eliminating the need for the graphical user interface.

The communication ports (wired communication port 54 and wireless communication port 56) permit bi-directional information generated by the tag processing device can be communicated to an external device, such as a computer.

For extended portability, the portable tag processing device 50 is powered by a self-contained battery 66. A switch 68 allows the user to selectively turn the tag processing device on and off. In other examples, the portable tag processing device is tethered to a power source with a power cord (not shown).

Although not shown, various of the user interface elements shown and described in connection with the portable tag processing device 50 can be included with the stationary tag diagnostic device shown in FIG. 8.

In certain applications, it may be useful to limit the amount of the tag diagnostic device and other elements of the tag processing device that are positioned at the point of use at which the tag diagnostic device is proximate the module or module-enclosing container having the programmable module tag. For example, only the tag diagnostic device antenna 46 and some immediate support electronics may be at the point of use. Other portions of the processor electronics and the user interface elements can be positioned remote from the point of use, connected to the tag diagnostic device antenna by additional communication elements (not shown).

In one implementation, the tag diagnostic device identifies a category into which to classify the module bearing the electronic module tag 20. The data processor 59 analyzes information received at the communication element 46 from the module tag to determine if the information matches one or another of predetermined category criteria. For example, the data processor may contain predetermined category criteria pertaining to a first category, a second category, etc. Such categories may include categories related to the amount that the module has been used (i.e. number of prints produced by a print module), or type of marketing program applicable to the module (sold or leased), or type of service program (all-inclusive, or individual charges), or other criteria. The data processor generates a processor result in accordance with the category match as determined in accordance with the category criteria. The processor results are communicated to another system, such as the computer 95, or to the user through a user interface such as the graphical user interface 60.

Figure 14:
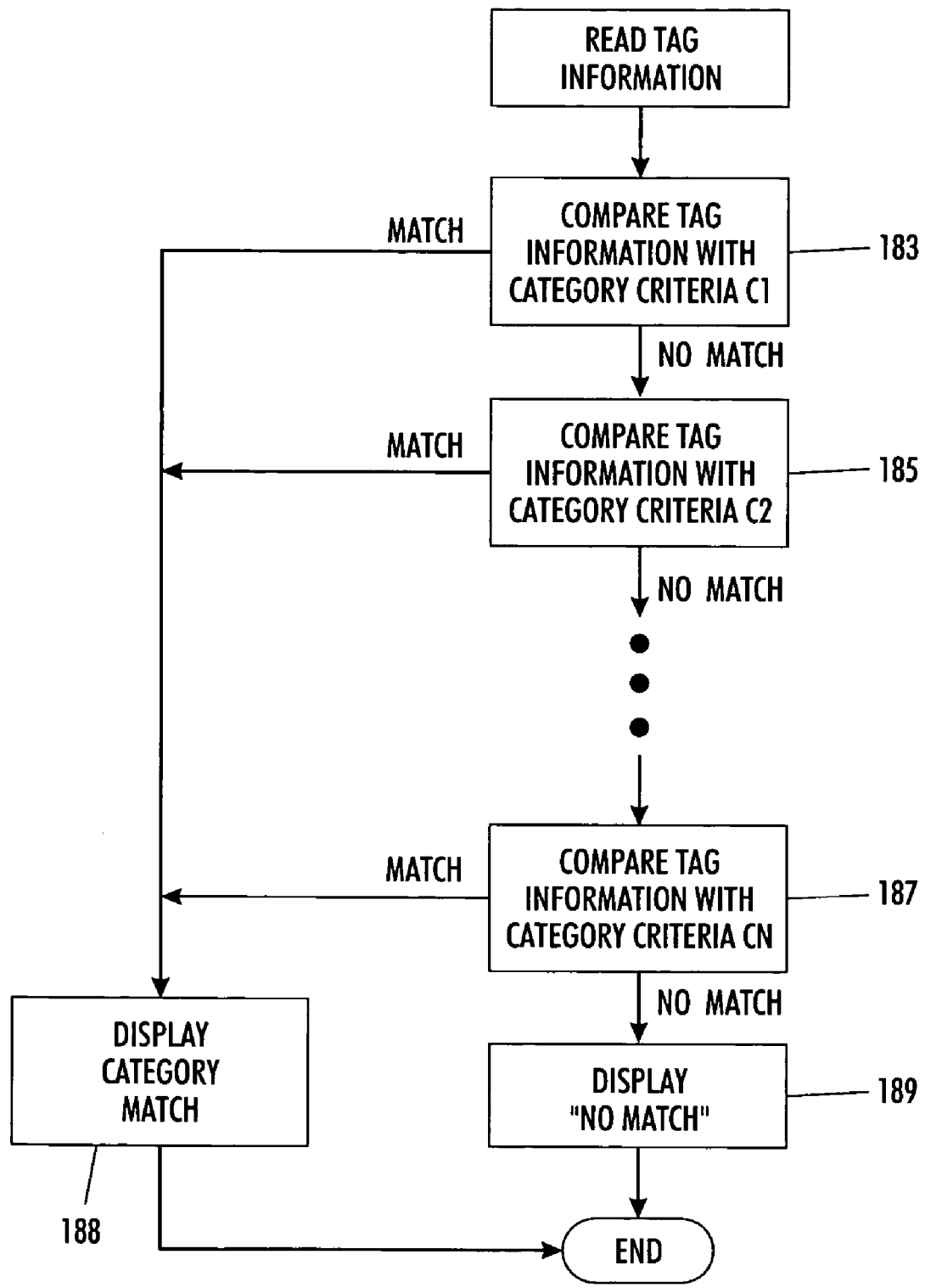
FIG. 14 is a simplified flow chart of a portion of an embodiment of a process incorporating aspects of the present invention.

In an exemplary application, the tag processor reads tag information from tags attached to expended (used) modules. The tag information may include information about the amount of usage to which the module has been put. By comparing the usage data from the module tag with usage category criteria, the data processor can categorize the module into one of a plurality of usage categories, and display that categorization to the user. Referring to the exemplary categorization process shown in FIG. 14, the processor compares received tag information with one category criteria C1 (183) to determine if the module fits a first category. If the tag information does not indicate a match for category criteria C1, the processor compares the tag information with a second category criteria C2 (185) to determine if the module fits a second category. The processor can continue the comparison process for a number of category criteria CN (187). The category match can be displayed 188 to the use on the graphic user interface 60, or, if there are a small number of categories, the category match can be displayed using the lights 62 or even audible signals from the speaker 64. The processor may include the capability to display a "no match" result 189 if the tag information does not match any of the predetermined category criteria. The user can use that categorization to place the module in an appropriate refurbishment or re-manufacturing category. In some implementations, the tag processor may include an on-board printer (not shown)_for printing a label with the determined categorization, which label can then be applied to the module.

To illustrate with a particular exemplary application, the module bearing the tag may be a replaceable print module containing toner, a photoreceptor, and other elements for use in a xerographic printer. Included in the tag information maybe the number of images the replaceable print module has made. The tag processing device reads that tag information, and identifies the numbers of images in that information. The processor compares the read number of images against one or more category criteria that include imaging thresholds. For example, if the number of images produced is less than a first threshold, the module maybe placed in a "refill" category. If the number of images is greater than the first threshold, but less than a second (higher) threshold, the module may be placed in a "light re-manufacturing" category. If the number of images is greater than the second threshold, the module may be placed in a "full re-manufacturer" category. Using the categorization information, the user can direct the module to the most appropriate processing facility.

Categorization may include non-exclusive categorization, or categorization based on multiple criteria. For example, if the number of images is less than the first threshold AND the date of manufacture (as indicated by tag information) is prior to a predetermined date, the module may be placed in a particular category, different from the category if the date of manufacture had been subsequent to the predetermined date. After studying the subject disclosure, a person of skill in the art can construct a categorization process consistent with any desired sorting objective.

By providing this categorization capability in a small, portable device, such categorization and proper directing of modules does not need to wait for the module to arrive at a central processing facility. This early categorization reduces transportation of modules, and speeds overall processing.

Figure 15:
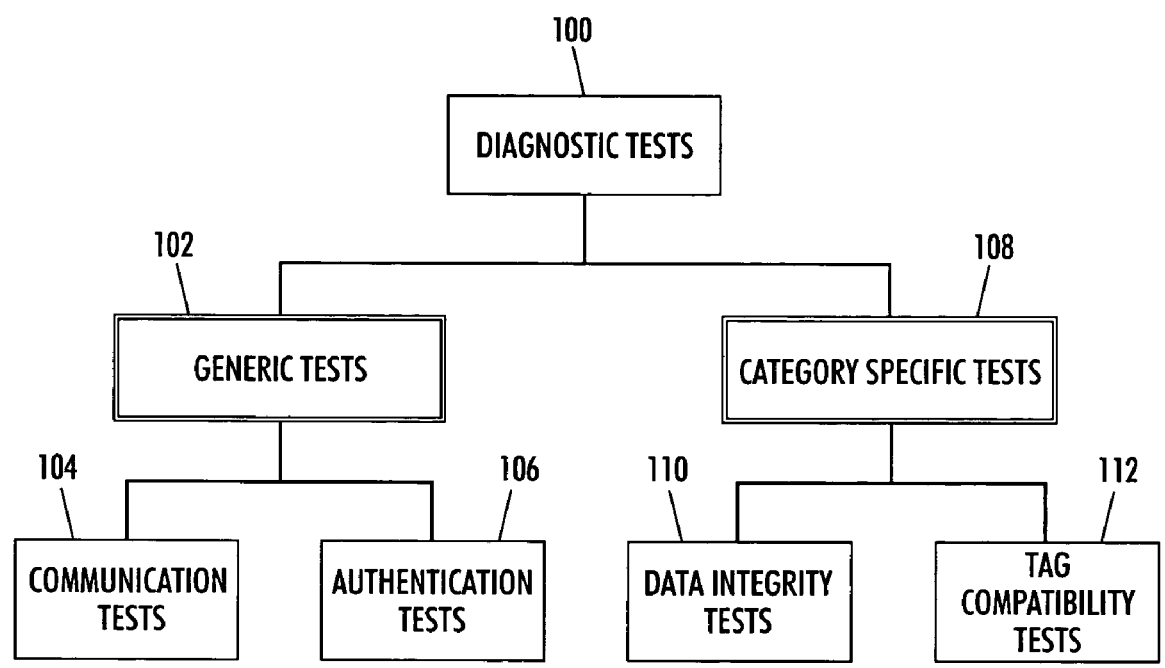
FIG. 15 is a simplified diagram of a structure of an embodiment of a portion of a system incorporating aspects of the present invention.

Other category criteria may include criteria to determine if the module failed in some manner. Such failure mode categorization information can be used to direct the failed module to the appropriate repair facility. In a further example, the data processor 59 includes diagnostic and repair functionality. The data processor may be programmed with instructions to cause the tag diagnostic device to perform diagnostic tests on an electronic module tag. The data processor causes the tag diagnostic device to communicate predetermined information requests to the electronic module tag. The data processor analyses the response (or lack thereof) from the module tag to determine whether the electronic module tag is operating within its proper parameters. The data processor may be adapted to perform sequences of diagnostic tests 100, such as those outlined in FIG. 15.

In an example, one branch of tests may include generic tests 102 that are applicable to electronic tags of many different categories. Such tests include communication sequence tests 104 to confirm that the electronic module tag 20 is communicating correctly through the tag communication element 26. The generic tests may also include authentication tests 106 to confirm the identity and authenticity of the electronic module tag.

Another branch of tests may include tests that are particular to a specific model or category of electronic tag. Such category specific tests 108 may include data integrity tests 110 that confirm that the data read from the electronic tag is of the expected size and type, and tag configuration compatibility tests 112 for confirming that the data read from the electronic tag is consistent with the module or machine with which the electronic module tag is associated.

Figure 16:
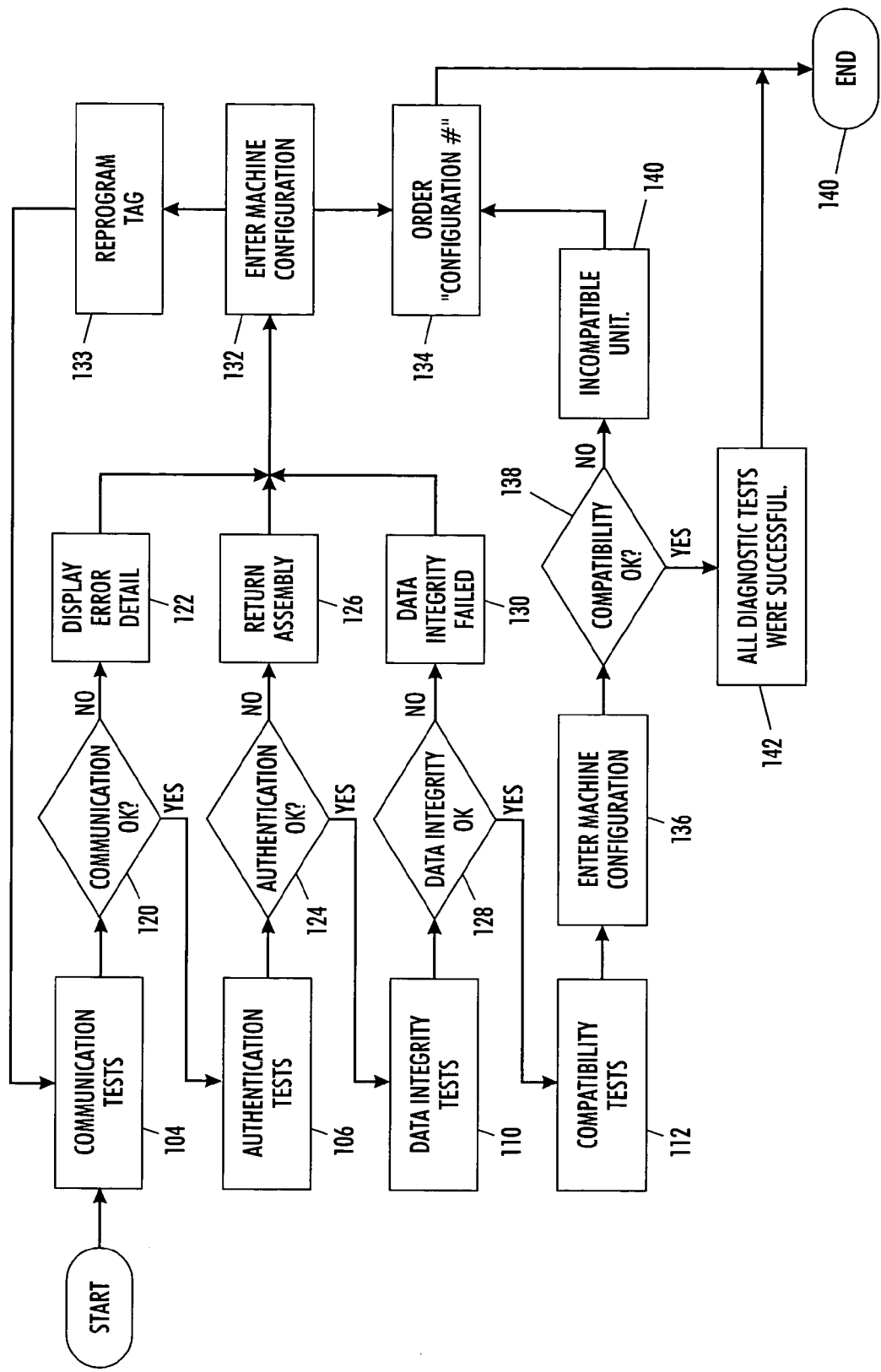
FIG. 16 is a simplified flow chart of a portion of an embodiment of a system incorporating aspects of the present invention.

FIG. 16 illustrates conceptually some of the diagnostic tests that may be performed by the tag processor under the control of the programmed data processor 59. The test categories are shown in a particular order that is logical in many circumstances. However, the tests may be performed in different orders. The different tests determine if the tag is operating within predetermined parameters of acceptable tag performance, using different criteria. From the different criteria, the diagnostic device can identify one or more error categories for a tag malfunction, and to communicate such information to the user of the diagnostic device.

As shown, a first set of diagnostic tests includes communication tests 104 that verify that the electronic tag is properly establishing a communication link with the tag diagnostic device. Failure to properly establish a communication link with the tag diagnostic device indicates a probable failure in the ability of the electronic tag to establish a communication link with a tag programming device or a tag reading device. The communication tests may include tests such as instructions to read particular cells from the tag memory 24, or instruction to write certain data to particular cells in the tag memory, and then read the data from those particular cells to confirm that the data was correctly communicated and stored. Certain electronic module tags have particular predetermined memory cells that cannot be written to or read from without affecting the performance of the tag. The communication tests are configured to bypass such cells and to avoid writing to or reading from such memory cells. Depending on the structure of the individual tag, other communication tests are devised for verifying correct operation of the data bus or other link among the memory, CPU, and other elements of the electronic tag. The details of the communication tests are determined by the structure of the electronic tag, including its memory element.

The data processor determines from the communication tests 104 whether communication with the module tag is within predetermined parameters. The data processor causes the results of the communication tests to be communicated to the user using various user communication elements of the diagnostic device. For example, a message can be displayed on the graphical user interface 60. If the communication test indicates a failure, the data processor identifies an error category from a predetermined set of error categories, and displays 122 a corresponding error detail (such as "Device Not Responding") on the graphical user interface. The data processor may also activate the signal lights 62 and the audio output 64 to alert the user to the test results. For example, if the communication tests indicate a failure to establish communication, the diagnostic device may cause a red signal light to illuminate, and/or the audio output to emit an audible signal such as a buzzer sound. If the communication tests are successful, a green signal light may be illuminated and/or the audio output may emit a different audible signal, such as a bell sound. In certain implementations, successful test results may not be communicated to the user, and the diagnostic device simply proceeds to the next tests.

The user can initiate the communication tests by pressing a particular key or combination of keys on the keypad 52, or by communicating an instruction from an external device through one of the communication ports 54, 56, in accordance with the programming of the diagnostic device.

Once the communication tests confirm basic communication with the electronic tag, more complicated tests can be performed. In an example, authentication tests 106 can be used to verify that the electronic tag is a genuine (not counterfeit) tag. Authentication tests may include an emulation test to probe the electronic tag with certain types of inquiries to determine if the tag produces the appropriate, expected results. Tests may include memory map validation tests and memory tests to validate certain read only data in the memory element of the electronic tag. Other tests may elicit the tag identification to determine the category of electronic module tag.

One or more communication sequence tests can be used as part of the authentication tests to verify that the electronic module tag is communicating information in the proper sequence. The electronic tag can be designed to produce certain predetermined results upon being presented with certain queries. In an example, in response to certain queries, the electronic tag may read out over the communication element the contents of certain cells in the memory element. In another example, or in response to different queries, the CPU of the electronic tag may perform a predetermined computation on the contents of certain cells in the memory element to produce computed results. The module tag then communicates these computed results over the tag communication element 26. The computation may encrypt the contents of one or more of the memory cells. In yet another embodiment, the computation manipulates the contents of one or more of the memory cells in accordance with a predetermined formula. The predetermined formula may be fixed, or it may vary over time according to another predetermined arrangement. The diagnostic device 46 communication element receives the results transmitted by the tag communication element 26. The data processor 59 of the diagnostic device analyzes the results to determine if the results are consistent with the results expected from an authentic electronic tag 124.

Again, the results of the authentication tests can be communicated to the user using the graphical user interface 60, the signal lights 62, and/or the audio output 64. For example, if the data processor determines that the results received from the electronic tag are inconsistent with an authentic tag, the processor can cause the graphical user interface to display a message 126 indicating that the electronic tag should be returned to the source or to another designated location.

If the results 124 of the authentication tests 106 indicate that a particular module tag being diagnosed is authentic, the tag diagnostic device proceeds with data integrity tests 110. Again, the diagnostic device electronics 44 and the data processor 59 cause the diagnostic device communication element (RF antenna) 46 to emit one or more test inquiries. The tag communication element (RF antenna) 26 receives the test inquiries, and processes them in accordance with the design of the module tag to produce tag results. The tag communicates the tag results from the tag communication element. The data integrity tests may include a data format validation, a data range validation, and a validation of relationships among variables used in the tag electronics.

The data processor compares the received tag results with the expected tag results 128. If the module fails the data integrity tests 110, the data processor can cause the user interface to display failure indications. For example, the graphical user interface 60 may display a message 130 that the data integrity tests failed. The message may include instructions to return the assembly of the module tag and associated module to a source, such as the manufacturer or a distributor. Other failure indications may include illumination of a particular one of the signal lights 62 and/or a particular type of audio signal from the audio output 64.

The machine user may need to replace a module associated with a tag that fails any one of the communication tests 104, the tag authentication tests 106, or the data integrity tests 108. To do so, the user of the diagnostic device enters information 132 about the machine with which the module is to be used (machine configuration information) for submission to the appropriate ordering or purchasing systems. Using the machine configuration information, the diagnostic system or an external ordering system identifies the module configuration appropriate for that machine configuration 134.

In certain circumstances, the nature of the tag failure may indicate that the tag can be reprogrammed for proper use. Such circumstances may particularly occur when the communication tests and the authentication tests are successful, but certain of the data integrity tests fail. The data processor, upon analyzing the nature of the failure, may determine that the failure coincides with a category of failure that can be rectified by reprogramming the tag.

If the data processor determines that the failure can be rectified by reprogramming the tag, a reprogramming process 133 is invoked. Using information such as the machine configuration and other information either read from the tag, or entered by the user, the data processor 59 of the diagnostic tool activates the diagnostic device communication element (RF antenna) 46 to transmit reprogramming information. The tag communication element (RF antenna) 26 receives the programming information and stores the correct tag data in the tag memory 24. The reprogramming process can be automatic, or it may interact with the user by displaying instructions or queries on the graphical user interface 60 and awaiting user input from the keypad 52 or other user input mechanism. One particular interactive process may include authentication of the user's reprogramming authority. The diagnostic device may display a request for the user's identity. The user may supply the requested information through a series of entries using the keypad 52 or through an identity card reader attached to the diagnostic device. The data processor can determine from the supplied identity information whether the user has authority to initiate the reprogramming of the tag. Once the tag has been reprogrammed, the reprogrammed tag can be subjected to the diagnostic tests to confirm successful reprogramming. In certain circumstances, the retesting may bypass the communication tests 104 and the authentication tests 106, and proceed directly to the data integrity tests 110.

If the data integrity tests 110 determine 128 that the data integrity is acceptable, a set of compatibility tests 112 are invoked to verify that the electronic module tag matches the environment in which the module tag is being used. The modules with which the module tag is associated are designed for use in particular environments, such as particular machines and particular geographic regions for optimum performance. This information is stored on the module tag.

The compatibility tests 112 may include a geographic validation test to confirm that the module to which the module tag is associated is being used in the geographic region for which the module was designed and manufactured. The compatibility tests may also include machine product family and machine product type validation tests. The operator of the diagnostic device enters information about the configuration of the machine in which the module is being used or to be used 136. The operator enters this information using the keypad 52, or using another device such as a portable computer that communicates with the diagnostic device through one of the communication ports 54, 56. The machine product family and machine product type validation tests verify compatibility between the machine and the module to which the module tag is associated. In an embodiment, the machine product family and machine product type validation tests are combined into a single machine model validation test that validates the particular machine model number against a list of proper machine models for the module identified by the information read by the tag diagnostic device reading the module tag.

The compatibility tests may also include a service plan validation test. Machines in which the module to which the module tag is associated may operate under different service plans that call for different types of modules. For example, if machine is a printer and the module is a replaceable module, such as a toner cartridge, different types of toner cartridges may be used for different service plans. One type of module may be appropriate for a machine for which the user purchases replaceable modules, while a different type of module is appropriate for a machine for which the user pays a set per print charge, and does not purchase individual replaceable modules. The service plan validation test verifies the correctness of the tag for the machine's service plan to ensure that the tag is of the type to record and communicate to the user the appropriate type of information that will allow the user to properly manage usage of the machine under that user's machine service plan. When the user of the diagnostic device enters machine configuration information into the diagnostic device, the configuration information includes information about the machine service plan.

The data processor examines the results of the compatibility tests 112 to determine 138 if the module tag is compatible with the geographic region, the machine, and the machine service plan. Because the tag is associated with a particular replaceable module for the machine, the compatibility tests for the module tag also reveal to at least some degree whether the module is compatible with the machine.

If the compatibility tests reveal that the module tag is compatible with all of the geographic region, the machine, and the machine service plan, the diagnostic device proceeds to the end of the diagnostic routine. The diagnostic device may display indications to the user that all diagnostic tests were successful 142.

If the compatibility tests reveal that the module tag is incompatible with any one of the geographic region, the machine, or the machine service plan, the diagnostic device displays a failure indication. In an example, the user interface can display a text message such as, "incompatible unit" 140, and may also provide text or graphical information about the nature of the incompatibility. In addition, or in alternatives, a signal may be exhibited visually by at least one of the signal lights 62, and audibly by the audio output 64. From the nature of the incompatibility, the diagnostic device or other system may identify the correct module to order, and generate the correct module order configuration 134.

In an embodiment, rather than reading data from the module tag for each test, the diagnostic device reads once all the contents of the tag memory, and stores the tag data in memory on board the diagnostic device. The data processor is then able to perform authentication tests 106, data integrity tests 110, and tag compatibility tests 112 on the tag data without having to retransmit data from the module tag. Reading all the data at once also eliminates communication of selective data, which communication could, if intercepted, reveal proprietary information concerning the data structure of information stored in the tag memory.

Figure 17:
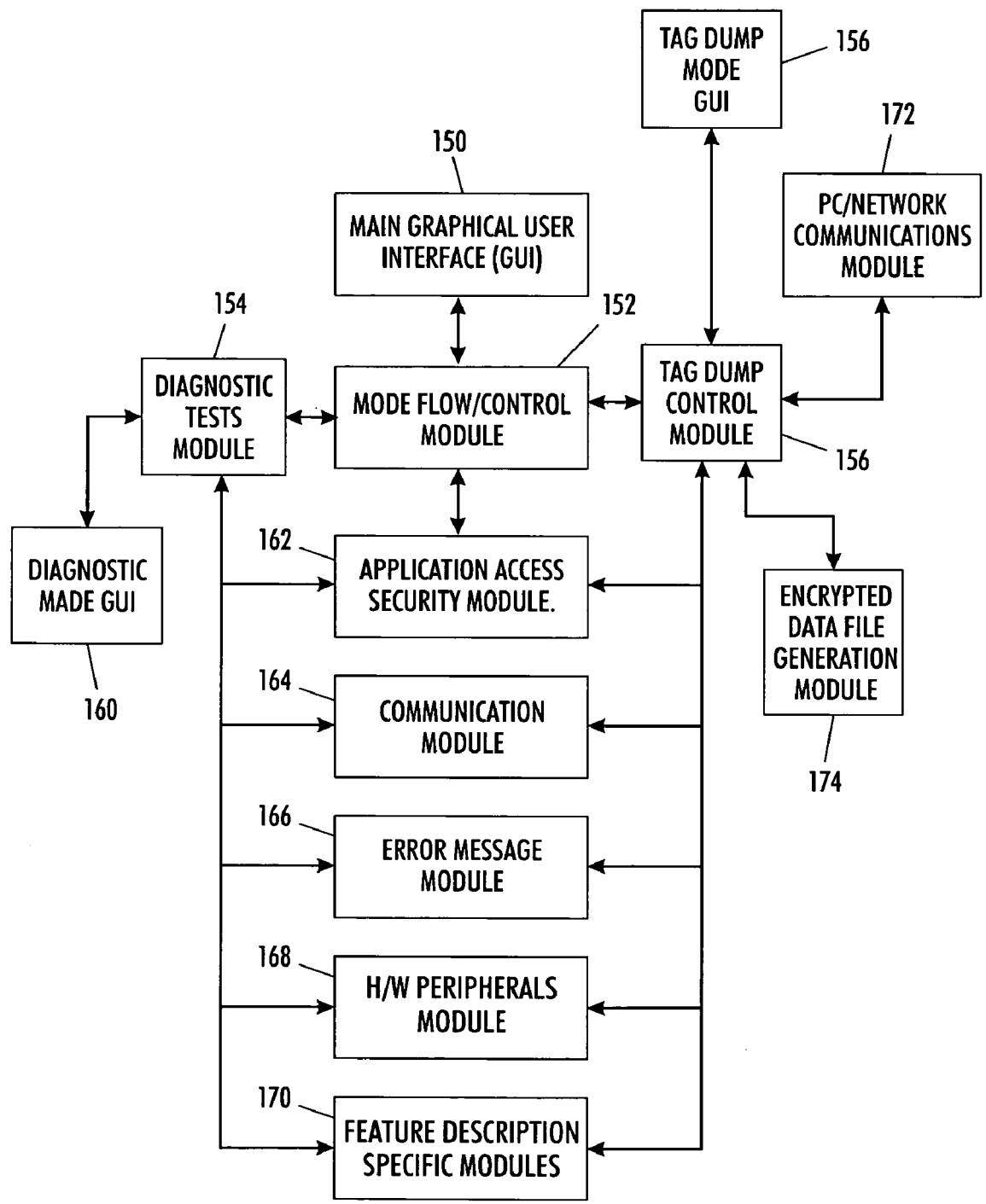
FIG. 17 is a simplified diagram of a structure of an embodiment of a portion of a system incorporating aspects of the present invention.

FIG. 17 illustrates an exemplary organization of the software contained in the diagnostic device. The software is organized modularly. The modular organization of the diagnostic software provides ease of support and maintenance. New tests specific to particular module tags can be added to the diagnostic software without disrupting other portions of the software.

The main graphical user interface (GUI) module 150 contains code that controls the user's access to the capabilities of the diagnostic device. The main graphical user interface module may control a password control interface on the graphical user interface 60. This module may also control the user's navigation through the different tests.

The mode flow/control module 152 controls the interaction of other modules, including the diagnostic tests module 154 and the tag dump control module 156. The tag dump control module governs the reading of the entire contents of the module tag memory so that the diagnostic device can analyze the data. A separate tag dump mode graphical user interface module 158 may provide information to the user vice the graphical user interface 60. A diagnostic mode graphical user interface (GUI) module 160 controls instructions and information provided to the user during the diagnostic tests. The diagnostic mode GUI module causes the different error messages to display in different colors on the graphical user interface for added user attention. An application access security module allows access to and use of the diagnostic tests of the diagnostic device to be limited. The application access security module performs password validation and provides a mechanism for changing passwords.

A communication module 164 handles low level (basic) communications between the diagnostic device and the module tag. An error message module 166 contains a list of all the error categories and their associated error codes and messages to be displayed on the graphical user interface 60. A hardware (H/W) peripherals module 168 contains code for handling interaction with peripheral hardware such as an accessory bar code scanner (not shown). One or more feature description specific modules 170 contain information relating to individual specific models of tags, specific tag features, and particular variables, definitions, interpretation of data, etc.

A PC/Network communications module 172 contains the code necessary to communicate information via one of the diagnostic device communication ports 54, 56 to a data network computer, or other external device.

An encrypted data file generation module 174 contains code to encrypt the data retrieved from the tag by the tag dump control module. Encrypting the tag data protects the information from unauthorized access.

Figure 11:
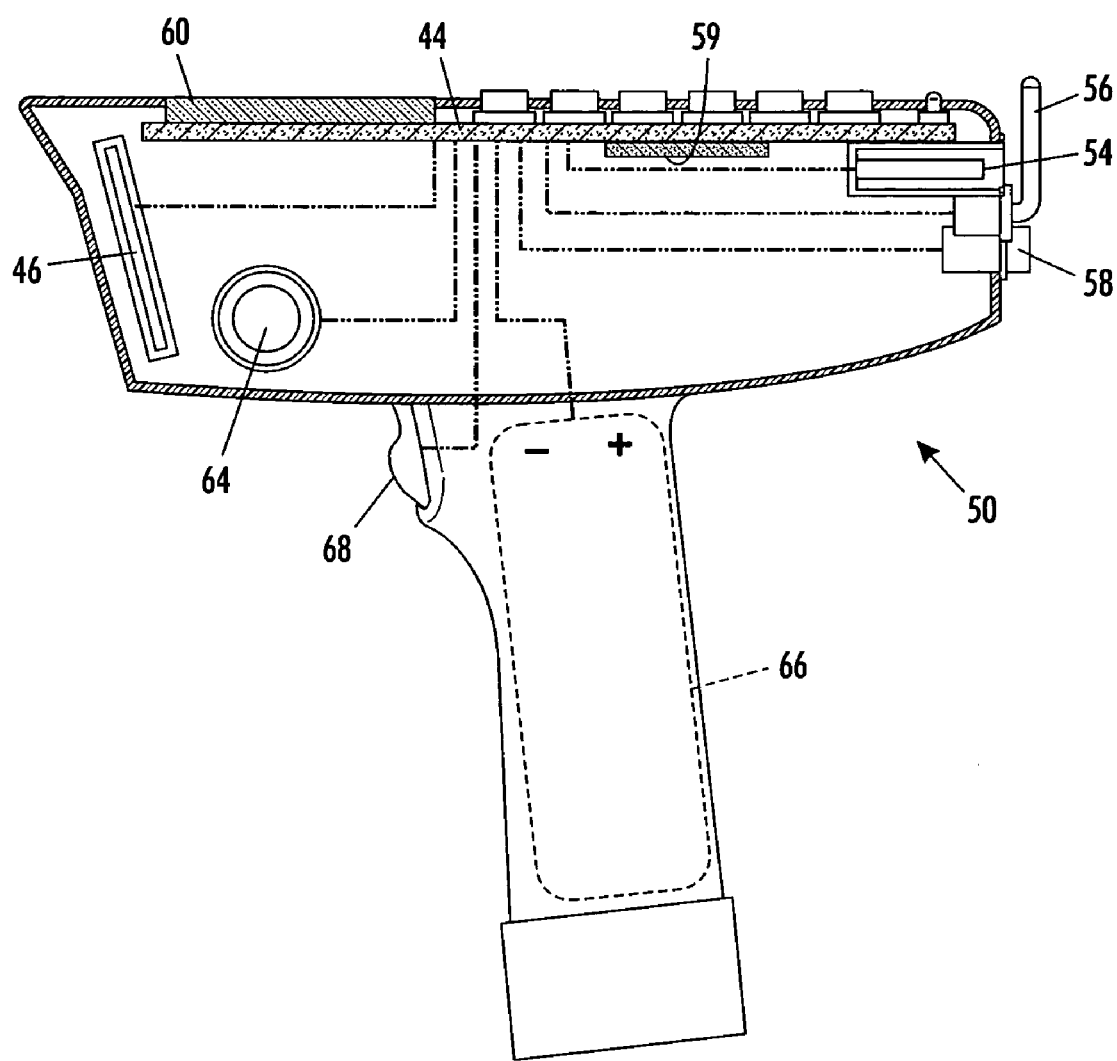
FIG. 11 is a cross-sectional view of the portable module tag diagnostic device of FIG. 10, taken along line 11—11 of FIG. 10.
Figure 12:
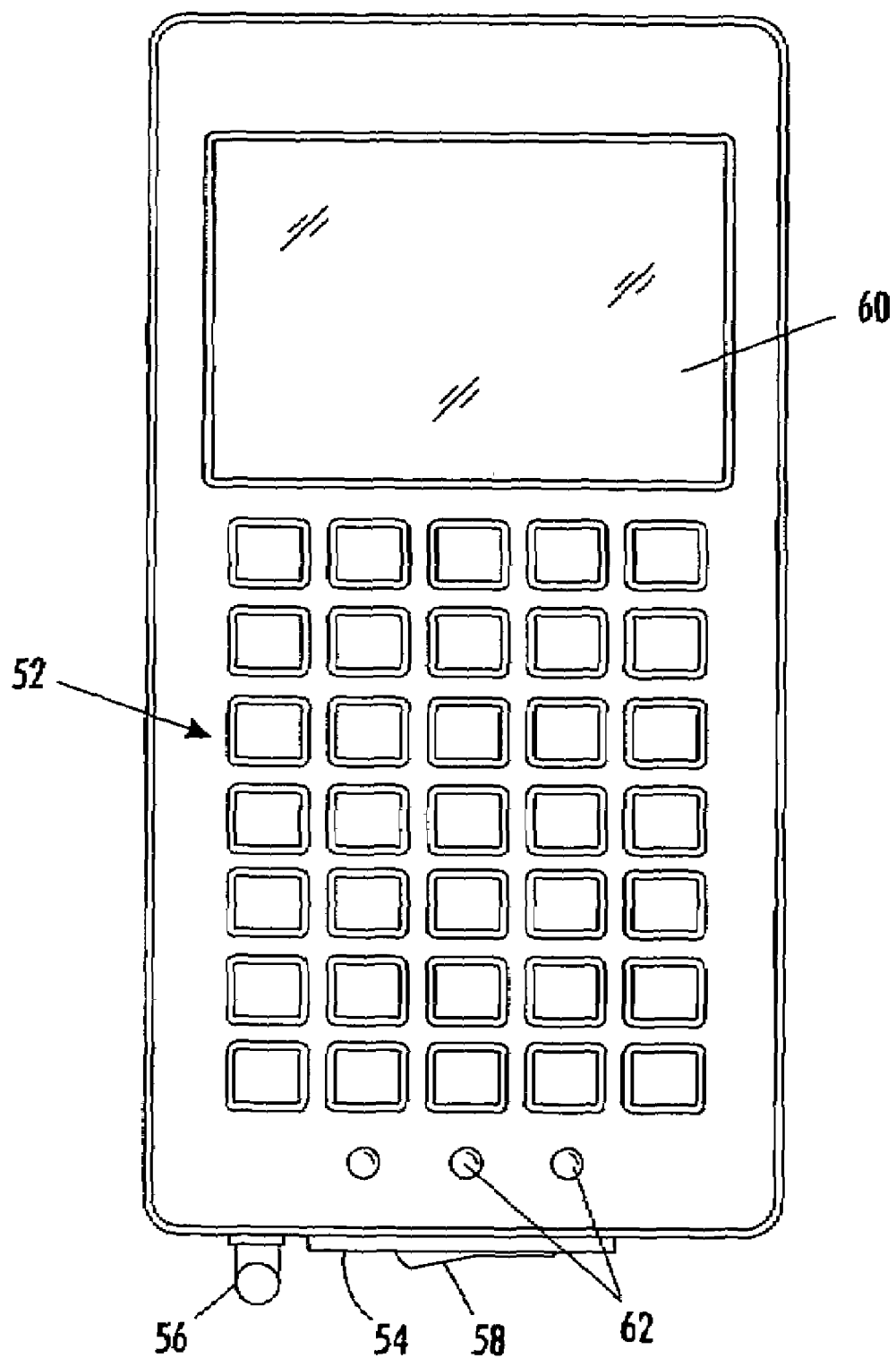
FIG. 12 is a top view of the portable module tag diagnostic device of FIG. 10.
Figure 13:
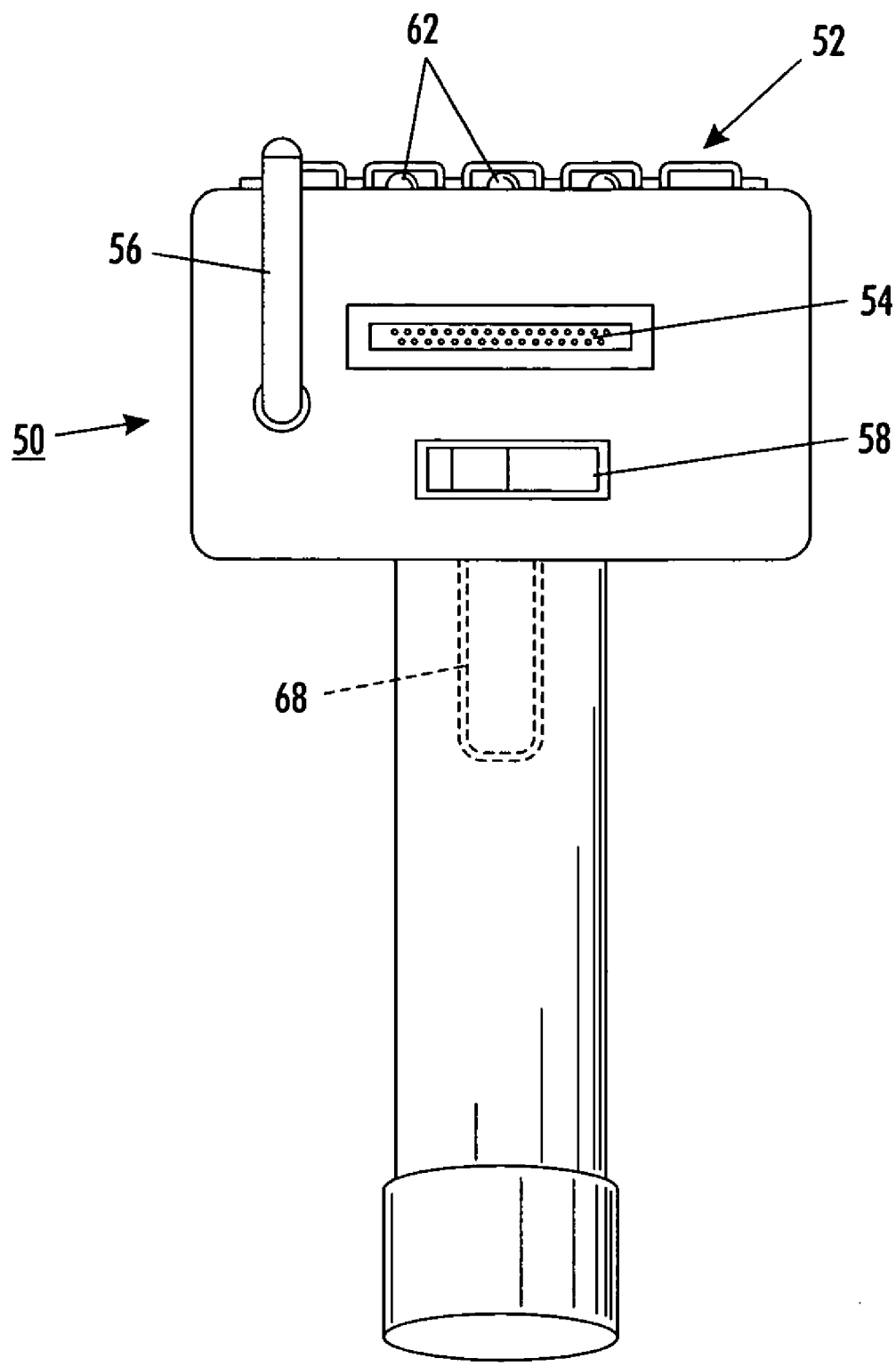
FIG. 13 is an end view of the rear of the portable module tag diagnostic device of FIG. 10.

These software modules may be stored in a memory device such as a hard drive (not shown) inside the diagnostic device. The software modules may also be embedded in firmware formed as part of the diagnostic device electronics 44 (FIG. 11).

FIGS. 8 and 9 conceptually illustrate operation of the electronic module tag diagnostic system and method. Although the drawing shows an arrangement in which the electronic module tag 20 is secured to a container 32 enclosing the module, persons skilled in the art will recognize that the process can also be applied to an electronic module tag attached to the module itself. The process can be applied to a module having an attached module tag whether the module is enclosed within a container or outside of a container. In addition, the process can be applied to a module installed in a machine.

With the tag diagnostic device 40 stationary, as shown in FIG. 8, the electronic module tag 20 is brought into proximity with the tag diagnostic device by bringing the module with which the electronic module tag 20 is associated into proximity with the tag diagnostic device. For example, the container 32 enclosing the module 30 (FIG. 3) and bearing the electronic module tag 20 is brought close enough to the stationary tag diagnostic device that the communication link is established between the electronic module tag and the tag diagnostic device. The communication link is established through the tag diagnostic device communication element 46 and the module tag communication element 26. With the portable tag diagnostic device 50 of FIG. 9, the tag diagnostic device can be brought into proximity with the electronic module tag.

Figure 18:
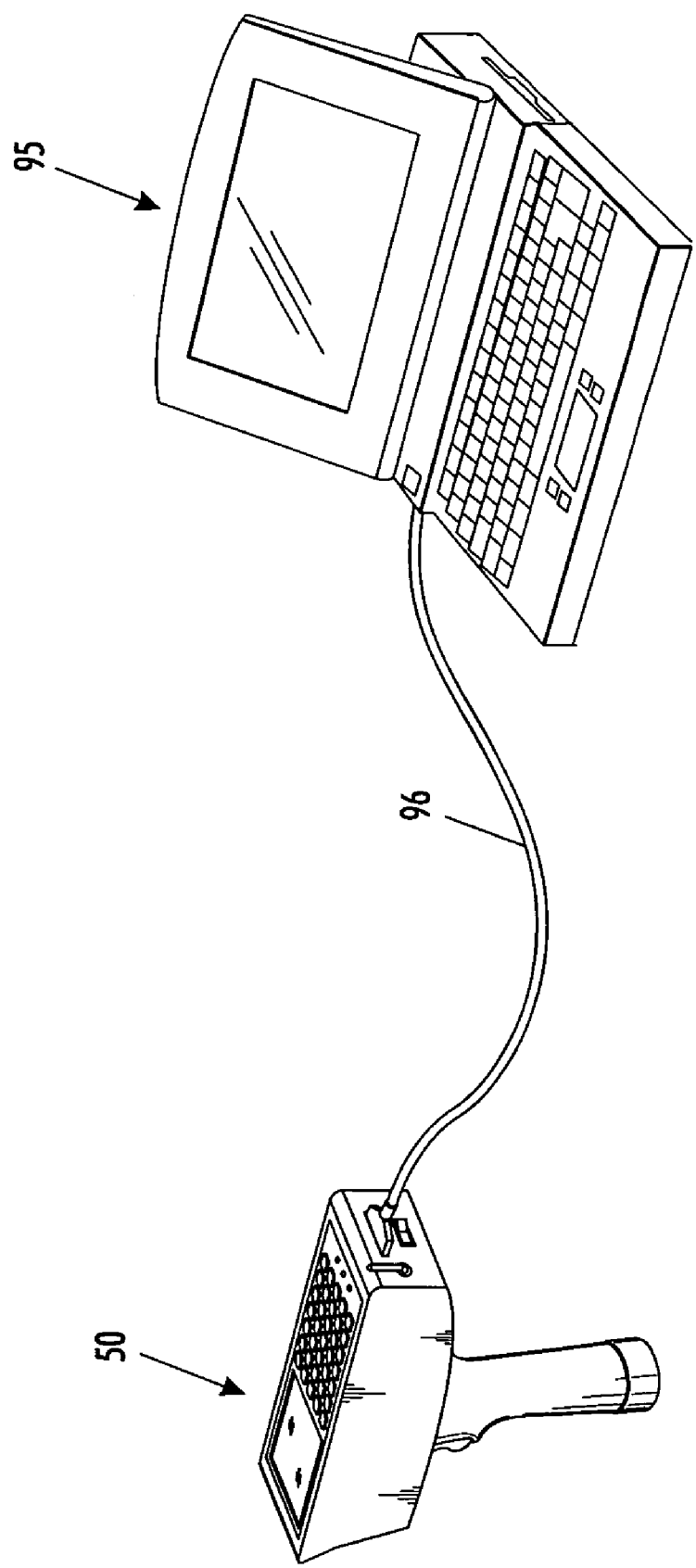
FIG. 18 is a perspective view of a portable diagnostic system incorporating an aspect of the present invention.

FIG. 18 illustrates an embodiment in which an external device, such as a notebook computer 95 is attached to the diagnostic device 50 by a cable 96. One end of the cable is attached to the diagnostic device through the wired communications port 54. The other end of the cable attaches to the notebook computer through one of the several ports available on a typical computer, such as parallel (printer) port, a serial port, or a USB (universal serial bus) port. The computer 95 can be used to provide instructions to the diagnostic device. In addition, the computer can download from the diagnostic device the results of the tests performed on module tags. The computer may be continuously connected to the diagnostic device, or it may be connected only occasionally.

While the invention has been described in the context of particular implementations, those skilled in the art, after studying the present disclosure, will recognize the various modifications can be made without departing from the spirit of the invention. Such modifications may include different configurations for the electronic module tag, different types of tag diagnostic devices and readers, and different placement of the electronic tag on the module, or on a container for enclosing the module. In addition, the module enclosed within the container can be a module other than a toner cartridge, and may include any type of replaceable module for a printing apparatus. Furthermore, the electronic tag can be used for modules other than replaceable modules for printing apparatus. Therefore, the scope of the invention is not to be limited to the specific implementations described above.

We claim:

1. An electronic diagnostic device for testing electronic monitoring tags associated with replaceable modules for a printing apparatus, the diagnostic device comprising:
    a tag reader comprising a reader wireless communication element;
    wherein the tag reader is adapted to read tag diagnostic information from a first electronic monitoring tag associated with a replaceable module for a printing apparatus using the reader wireless communication element;
    a data processor in communication with the tag reader;
    wherein the data processor is adapted to determine from the tag diagnostic data whether the first electronic monitoring tag is operating within predetermined parameters;
    wherein the data processor contains a predetermined set of error categories;
    wherein the data processor is additionally adapted to identify a first one of the error categories if the first electronic monitoring tag is operating outside a predetermined parameter other than an expected life of the replaceable module, and to generate error category information;
    wherein the data processor is additionally adapted to prepare corrective tag information responsive to the identification of the first one of the error categories; and
    a results communication element In communication with the data processor adapted to communicate the error category information generated by the data processor;
    wherein the results communication element includes a tag writer adapted to program the first electronic monitoring tag with the corrective tag information generated by the data processor in response to the identification of the first one of the error categories.

2. The electronic diagnostic device of claim 1, wherein the results communication element includes a results display for displaying the error category information to a user.

3. The electronic diagnostic device of claim 2, wherein the results display includes a graphical user interface.

4. The electronic diagnostic device of claim 1, wherein:
    the results communication element is adapted to display one of a predetermined set of error messages; and
    each of the error messages corresponds to one of the error categories.

5. An electronic diagnostic device comprising:
    a tag reader;
    wherein the tag reader is adapted to read tag diagnostic information from a first electronic monitoring tag associated with a replaceable module of a printing apparatus;

a data processor in communication with the tag reader;
wherein the data processor is adapted to analyze the tag diagnostic data to produce tag diagnosis information;
wherein the data processor is adapted to determine from the tag diagnostic data whether the first electronic monitoring tag is within predetermined parameters other than the expected end of the life of the replaceable module; and
wherein the data processor is additionally adapted to identify one of a plurality of error categories if the first electronic monitoring tag is not within predetermined parameters other than the expected end of the life of the replaceable module;
wherein the data processor is additionally adapted to prepare corrective tag information responsive to the identification of the one error category; and
a results communication element in communication with the data processor for communicating the tag diagnosis information;
wherein the results communication element is a tag writer adapted to program the first electronic monitoring tag with the corrective tag information generated by the data processor in response to the identification of the one error category.

6. The electronic diagnostic device of claim 5, wherein the communication element is a display adapted to display the identified error category to a human user.

7. The electronic diagnostic device of claim 5, wherein the results communication element is a results display for displaying information to a human user.

8. The electronic diagnostic device of claim 5, wherein the tag reader is a wireless tag reader.

9. The electronic diagnostic device of claim 8, wherein the wireless tag reader is a radio frequency tag reader.

10. A method of testing electronic monitoring tags associated with replaceable modules of printing apparatus, the method comprising:
bringing a portable electronic reader device into proximity with a first electronic tag associated with a replaceable module of a printing apparatus;
causing the portable electronic tag reader to read tag diagnostic data from the first electronic tag;
electronically determining from the tag diagnostic data whether the first electronic tag is operating within a plurality of predetermined operating parameters;
transmitting an error signal if the first electronic tag is not operating within the predetermined operating parameters;
wherein electronically determining from the tag diagnostic information whether the first electronic tag is operating within predetermined operating parameters comprises:
performing on the read tag diagnostic data at least one generic test applicable to diagnostic information from electronic tags of any of a predetermined plurality of tag categories;
determining from the read tag diagnostic data to which one of a plurality of tag categories the first electronic tag belongs; and
performing a diagnostic test peculiar to the tag category to which the first electronic tag is determined to belong.

11. The method of claim 10, wherein causing the portable electronic tag reader to read the tag diagnostic information from the first electronic tag comprises causing the tag reader to read all of the data stored in the first electronic tag.

12. The method of claim 10, wherein:
determining the tag which one of the plurality of tag categories the first electronic tag belongs comprises determining whether the first electronic tag belongs to a first tag category or to a second tag category; and
performing the diagnostic test peculiar to the tag category to which the first electronic tag is determined to belong comprises performing a first diagnostic test if the tag belongs to the first tag category, and performing a second diagnostic test if the tag belongs to the second tag category.

13. An electronic diagnostic device for testing electronic monitoring tags associated with replaceable modules for a printing apparatus, the diagnostic device comprising:
a tag reader comprising a reader wireless communication element;
wherein the tag reader is adapted to read tag diagnostic information from a first electronic monitoring tag associated with a replaceable module for a printing apparatus using the reader wireless communication element;
an electronic data processor in communication with the tag reader;
wherein the data processor is adapted to determine from the tag diagnostic data whether the first electronic monitoring tag belongs to a first tag category or to a second tag category;
wherein the data processor is adapted so that when the data processor determines the first electronic monitoring tag belongs to the first tag category, the data processor determines from the tag diagnostic data whether the first electronic monitoring tag is operating within first predetermined parameters;
wherein the data processor is adapted so that when the data processor determines the first electronic monitoring tag belongs to the second tag category, the data processor determines from the tag diagnostic data whether the second electronic monitoring tag is operating within second predetermined parameters;
wherein the data processor contains a predetermined set of error categories;
wherein the data processor is additionally adapted to identify one of the error categories if the first electronic monitoring tag is operating outside the first or second predetermined parameters, and to generate error category information; and
a results communication element in communication with the data processor adapted to communicate the error category information generated by the data processor.

14. The electronic diagnostic device of claim 13, wherein:
the data processor is additionally adapted to prepare corrective tag information responsive to error category information identifying that the first electronic monitoring tag is operating outside the first or second predetermined parameters; and
the results communication element includes a tag writer adapted to program the first electronic monitoring tag with the corrective tag information.

15. The electronic diagnostic device of claim 13, wherein the first and second predetermined parameters pertain to factors other than the end of the life of the replaceable module.

16. An electronic diagnostic device for testing electronic monitoring tags associated with replaceable modules for a printing apparatus, the diagnostic device comprising:
a tag reader comprising a reader wireless communication element;

wherein the tag reader is adapted to use the reader wireless communication element to read tag diagnostic information from a first electronic monitoring tag associated with a replaceable module for a printing apparatus; and an electronic data processor In communication with the tag reader;

wherein the data processor is adapted to determine from the tag diagnostic information to which a plurality of tag categories the first electronic monitoring tag belongs;

wherein the data processor is adapted to perform on the tag diagnostic Information a generic test applicable to diagnostic information of electronic monitoring tags of multiple tag categories, to determine whether the first electronic monitoring tag is operating within first predetermined parameters; and wherein the data processor is adapted to perform on the tag diagnostic information a peculiar diagnostic test peculiar to the tag category to which the first electronic monitoring tag belongs to determine whether the first electronic monitoring tag is operating within second predetermined parameters.

17. The electronic diagnostic device of claim 16, wherein the first and second predetermined parameters pertain to factors other than the end of the life of the replaceable module.

* * * * *